US009312181B2

(12) United States Patent
Choi et al.

(10) Patent No.: US 9,312,181 B2
(45) Date of Patent: Apr. 12, 2016

(54) SEMICONDUCTOR DEVICE, ELECTRONIC DEVICE INCLUDING THE SAME AND MANUFACTURING METHODS THEREOF

(71) Applicant: Samsung Electronics Co., Ltd., Suwon-si (KR)

(72) Inventors: Yong-Joon Choi, Seoul (KR); Myeongcheol Kim, Suwon-si (KR); Cheol Kim, Hwaseong-si (KR); GeumJung Seong, Seoul (KR); Hak-Sun Lee, Suwon-si (KR); Haegeon Jung, Yongin-si (KR); Ji-Eun Han, Incheon (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 9 days.

(21) Appl. No.: 14/531,987

(22) Filed: Nov. 3, 2014

(65) Prior Publication Data

US 2015/0162247 A1 Jun. 11, 2015

(30) Foreign Application Priority Data

Dec. 11, 2013 (KR) ........................ 10-2013-0153989

(51) Int. Cl.

| | |
|---|---|
| ***H01L 21/336*** | (2006.01) |
| ***H01L 21/8234*** | (2006.01) |
| ***H01L 27/088*** | (2006.01) |

(Continued)

(52) U.S. Cl.
CPC .... *H01L 21/823431* (2013.01); *H01L 21/3081* (2013.01); *H01L 21/76224* (2013.01); *H01L 27/0886* (2013.01)

(58) Field of Classification Search
CPC .................. H01L 27/0886; H01L 21/823431; H01L 21/3081; H01L 21/76224; H01L 21/76229; H01L 21/823481; H01L 21/823821; H01L 21/845; H01L 29/66795
See application file for complete search history.

(56) References Cited

U.S. PATENT DOCUMENTS

| | | | |
|---|---|---|---|
| 6,218,262 B1 | 4/2001 | Kuroi et al. | |
| 2011/0269287 A1* | 11/2011 | Tsai .................... | H01L 21/2254 438/306 |
| 2012/0025315 A1 | 2/2012 | Kronholz et al. | |

(Continued)

FOREIGN PATENT DOCUMENTS

| | | |
|---|---|---|
| JP | H11-214498 A | 8/1999 |
| KR | 10-2007-0082921 A | 8/2007 |

(Continued)

*Primary Examiner* — Thanh Y Tran
(74) *Attorney, Agent, or Firm* — Muir Patent Law, PLLC

(57) ABSTRACT

The disclosure provides semiconductor devices and methods of manufacturing the same. The method includes etching a substrate using a first mask pattern formed on the substrate to form a trench, forming a preliminary device isolation pattern filling the trench and including first and second regions having first thicknesses, forming a second mask pattern on the first region, etching an upper portion of the second region and a portion of the first mask pattern, which are exposed by the second mask pattern, to form a second region having a second thickness smaller than the first thickness, removing the first and second mask patterns, and etching upper portions of the first region and the second region having the second thickness to form a device isolation pattern defining preliminary fin-type active patterns. An electronic device including a semiconductor device and a manufacturing method thereof are also disclosed.

20 Claims, 56 Drawing Sheets

(51) Int. Cl.
*H01L 21/762* (2006.01)
*H01L 21/308* (2006.01)

(56) References Cited

U.S. PATENT DOCUMENTS

2013/0043521 A1 2/2013 Jung
2013/0187237 A1 7/2013 Yu et al.
2013/0270620 A1* 10/2013 Hu .................... H01L 21/76229 257/296
2014/0357037 A1* 12/2014 Adam ............. H01L 21/823412 438/283

FOREIGN PATENT DOCUMENTS

KR 10-2009-0021961 A 3/2009
KR 10-0954418 B1 4/2010

* cited by examiner

SEMICONDUCTOR DEVICE, ELECTRONIC DEVICE INCLUDING THE SAME AND MANUFACTURING METHODS THEREOF

CROSS-REFERENCE TO RELATED APPLICATION

This application claims priority under 35 U.S.C. §119 to Korean Patent Application No. 10-2013-0153989, filed on Dec. 11, 2013, in the Korean Intellectual Property Office, the disclosure of which is hereby incorporated by reference in its entirety.

BACKGROUND

The present disclosure relates to semiconductor devices and methods of manufacturing the same and, more particularly, to semiconductor devices including fin-type transistors and methods of manufacturing the same.

Semiconductor devices are widely used in the electronics industry because of their small size, multi-function, and/or low manufacture costs. These semiconductor devices may include memory devices storing data, logic devices processing data, or hybrid devices performing various functions.

Highly integrated semiconductor devices have been increasingly demanded with the development of the electronics industry. At the same time, various problems have been caused. For example, process margins of photolithography processes defining fine patterns have been reduced. In addition, high-speed semiconductor devices have been demanded with the development of the electronic industry. Various research is conducted to satisfy the above demands.

SUMMARY

Embodiments of the inventive concepts may provide highly integrated semiconductor devices.

Embodiments of the inventive concepts may also provide methods of manufacturing a highly integrated semiconductor device.

In one aspect, the method may include: etching a substrate using a first mask pattern formed on the substrate to form a trench; forming a preliminary device isolation pattern filling the trench and including a first region and a second region, each of the first and second regions having a first thickness; forming a second mask pattern on the first region; etching an upper portion of the second region and a portion of the first mask pattern, which are exposed by the second mask pattern, to form a second region having a second thickness smaller than the first thickness; removing the first and second mask patterns; and etching upper portions of the first region and the second region having the second thickness to form a device isolation pattern defining preliminary fin-type active patterns.

In some embodiments, the first mask pattern may be removed by a phosphoric acid strip process, and the first mask pattern may include a nitride.

In some embodiments, each of the preliminary fin-type active patterns may have a rectangular shape extending in a first direction, and the preliminary fin-type active patterns may be spaced apart from each other in the first direction and a second direction perpendicular to the first direction. The first region of the preliminary device isolation pattern may be formed between the preliminary fin-type active patterns spaced apart from each other in the first direction, and the second region of the preliminary device isolation pattern may be formed between the preliminary fin-type active patterns spaced apart from each other in the second direction.

In some embodiments, the second mask pattern may be removed by an ashing process and/or a strip process, and the second mask pattern may include a photoresist pattern.

In some embodiments, a top surface of the second region having the second thickness may be disposed at a level higher than a top surface of the substrate.

In some embodiments, the method may further include: etching the second region having the second thickness to form a third thickness smaller than the second thickness. The top surface of the second region having the third thickness may be disposed at a substantially same level as the top surface of the substrate.

In some embodiments, etching the upper portions of the first region and the second region having the second thickness to form a device isolation pattern defining preliminary fin-type active patterns may include: etching an upper portion of the first region of the preliminary device isolation pattern to form a first device isolation region of the device isolation pattern; and etching an upper portion of the second region of the preliminary device isolation pattern to form a second device isolation region of the device isolation pattern. In this case, the first device isolation region of the device isolation pattern may have a top surface disposed at a substantially same level as a top surface of the substrate, and the second device isolation region of the device isolation pattern may have a top surface disposed at a level lower than the top surface of the substrate.

In some embodiments, the method may further include: forming pattern structures including a first pattern structure and a second pattern structure, the first pattern structure disposed on the first device isolation pattern, and the second pattern structure crossing over the preliminary fin-type active patterns and the second device isolation pattern; etching the preliminary fin-type active patterns exposed by the pattern structures to form fin-type active patterns; and forming dopant patterns on the fin-type active patterns at both sides of each of the pattern structures.

In some embodiments, forming the pattern structures may include: sequentially forming an insulating layer and a material layer on the preliminary fin-type active patterns and the device isolation pattern; planarizing the top surface of the material layer; forming third mask patterns on the planarized material layer; etching the planarized material layer and the insulating layer using the third mask patterns as an etch mask to form line patterns and insulating patterns; and forming spacers on sidewalls of the line patterns and insulating patterns.

In some embodiments, the line pattern of the first pattern structure may have a third thickness on the first device isolation region. The line pattern of the second pattern structure may have a fourth thickness on the fin-type active pattern and may have a fifth thickness on the second device isolation region. The fourth thickness may be substantially equal to the third thickness, and the fifth thickness may be greater than the fourth thickness.

In some embodiments, the method may further include: forming an interlayer insulating layer on the substrate having the pattern structures and the dopant patterns; removing the line patterns and insulating patterns of the pattern structures to form openings exposing the device isolation pattern and the fin-type active patterns; and forming gate insulating patterns and gate electrodes in the openings to form gate structures.

In another aspect, the semiconductor device may include: a plurality of fin-type active patterns protruding from a substrate, each of the fin-type active patterns having a rectangular shape extending in a first direction, and the fin-type active patterns spaced apart from each other in the first direction and a second direction perpendicular to the first direction; a device isolation pattern including a first device isolation region having a first thickness and a second device isolation region having a second thickness smaller than the first thickness, the first device isolation region disposed between the fin-type active patterns spaced apart from each other in the first direction, and the second device isolation region disposed between the fin-type active patterns spaced apart from each other in the second direction; a first gate structure extending in the second direction on the first device isolation region, the first gate structure including a first insulating pattern and a first gate electrode; a second gate structure extending in the second direction on the fin-type active patterns and the second device isolation region, the second gate structure including a second insulating pattern and a second gate electrode; and dopant patterns disposed on the fin-type active patterns at both sides of the second gate structure. The thickness of the first gate electrode may be substantially equal to the thickness of the second gate electrode disposed on the fin-type active pattern.

In some embodiments, a top surface of the first gate structure may be disposed at a substantially same level as a top surface of the second gate structure.

In some embodiments, top surface of the first device isolation region may be disposed at a substantially same level as a top surface of the fin-type active pattern under the second gate structure.

In some embodiments, a top surface of the second device isolation region may be lower than a top surface of the fin-type active pattern under the second gate structure.

In another aspect, a method of manufacturing an electronic device comprises forming a first mask pattern on a substrate, etching the substrate using the first mask pattern to form a trench, forming a preliminary device isolation pattern filling the trench and having a first and a second regions which have a first thickness, forming a second mask pattern on the first region and on a portion of the substrate adjacent to the first region, etching an upper portion of the second region and a portion of the first mask pattern, which are exposed by the second mask pattern, to form a second region having a second thickness smaller than the first thickness, etching the second region having the second thickness to form a third thickness smaller than the second thickness, removing the first and second mask patterns, etching an upper portion of the first region of the preliminary device isolation pattern to form a first device isolation region of the device isolation pattern, and etching an upper portion of the second region of the preliminary device isolation pattern to form a second device isolation region of the device isolation pattern, wherein a top surface of the first device isolation region of the device isolation pattern is at a different level from a top surface of the substrate adjacent to the first device isolation region.

The top surface of the first device isolation region of the device isolation pattern may be more than 30 angstroms higher than the top surface of the substrate adjacent to the first device isolation region.

The step of etching an upper portion of the first region of the preliminary device isolation pattern to form a first device isolation region of the device isolation pattern, and the step of etching an upper portion of the second region of the preliminary device isolation pattern to form a second device isolation region of the device isolation pattern may be performed in the same process.

The height difference between a top surface of the second device isolation region and the top surface of the substrate adjacent to the second device isolation region may be more than 5 times bigger than the height difference between the top surface of the first device isolation region and the top surface of the substrate adjacent to the first device isolation region.

The manufacturing method of the electronic device may further comprises a step of assembling the substrate to form an electronic device, wherein the electronic device may be a computer or a mobile device.

BRIEF DESCRIPTION OF THE DRAWINGS

The present disclosure will become more apparent in view of the attached drawings and accompanying detailed description.

FIGS. 3A through 11A are plan views illustrating a method of manufacturing a semiconductor device according to some embodiments of the inventive concepts;

FIGS. 3B through 11B are cross-sectional views taken along lines I-I' of FIGS. 3A through 11A, respectively;

FIGS. 3C through 11C are cross-sectional views taken along lines II-II' of FIGS. 3A through 11A, respectively;

FIGS. 3D through 11D are cross-sectional views taken along lines of FIGS. 3A through 11A, respectively;

DETAILED DESCRIPTION

Figure 1A:
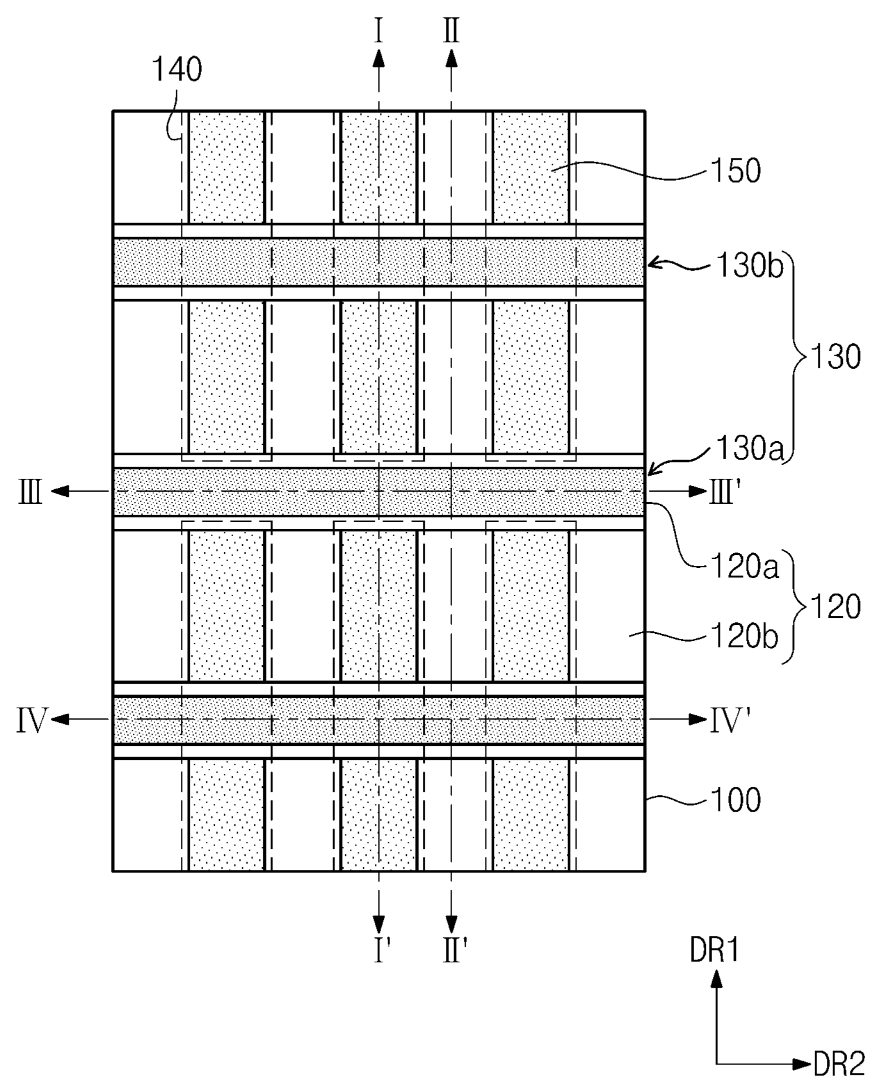
FIG. 1A is a plan view illustrating a semiconductor device according to some embodiments of the inventive concepts.

The disclosure will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein. Certain drawings are exaggerated for clarity.

The terminology used herein is for the purpose of describing particular embodiments only and is not intended to limit the invention. As used herein, the singular terms “a,” “an” and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. However, the term "contact" as used herein refers to a direct contact, or touching.

Also, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the embodiments. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limiting the scope of the inventive concepts.

It will be also understood that although the terms first, second, third etc. may be used herein to describe various elements, these elements should not be limited by these terms. Unless the context indicates otherwise, these terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein. Therefore, exemplary embodiments should be construed to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions in the microelectronic device. The two directions may be orthogonal or may have some other angle with respect to each other. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction. The third direction may be orthogonal to the two different directions, or may have some other angle with respect to the two different directions. The three directional replications provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" or "about" may be used herein to reflect this meaning.

Figure 1B:
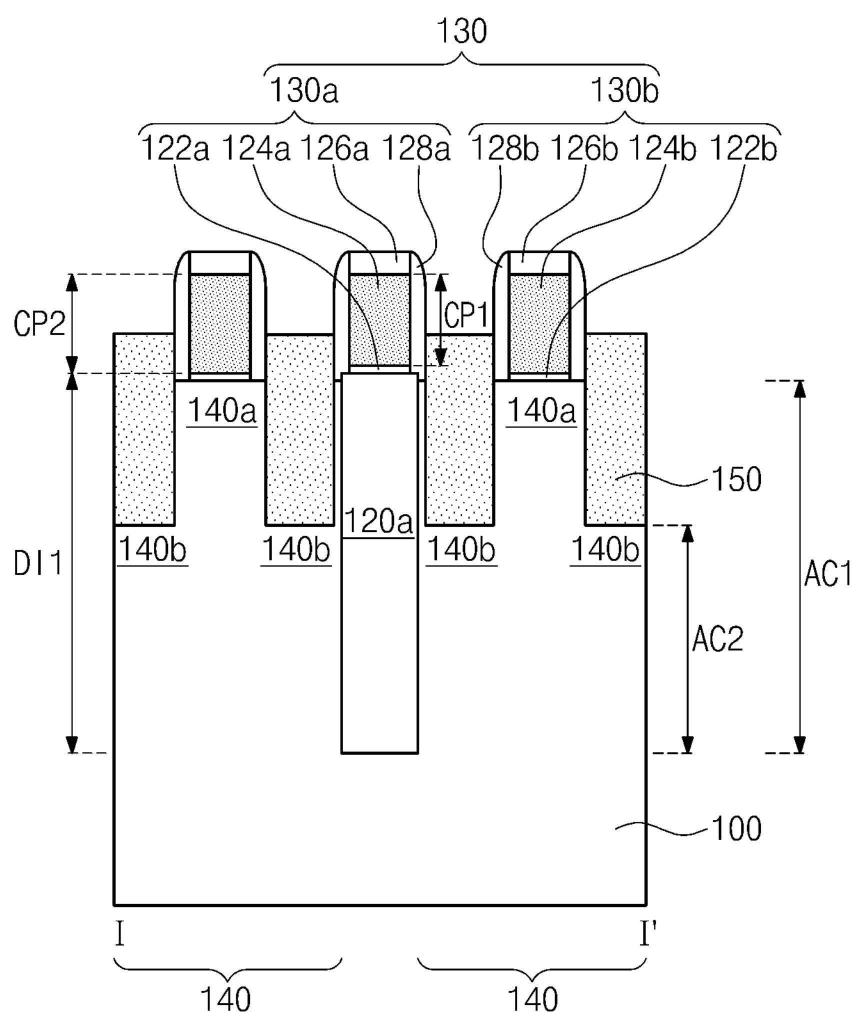
FIGS. 1B, 1C, 1D, and 1E are cross-sectional views taken along lines I-I', and IV-IV' of FIG. 1A, respectively.
Figure 1C:
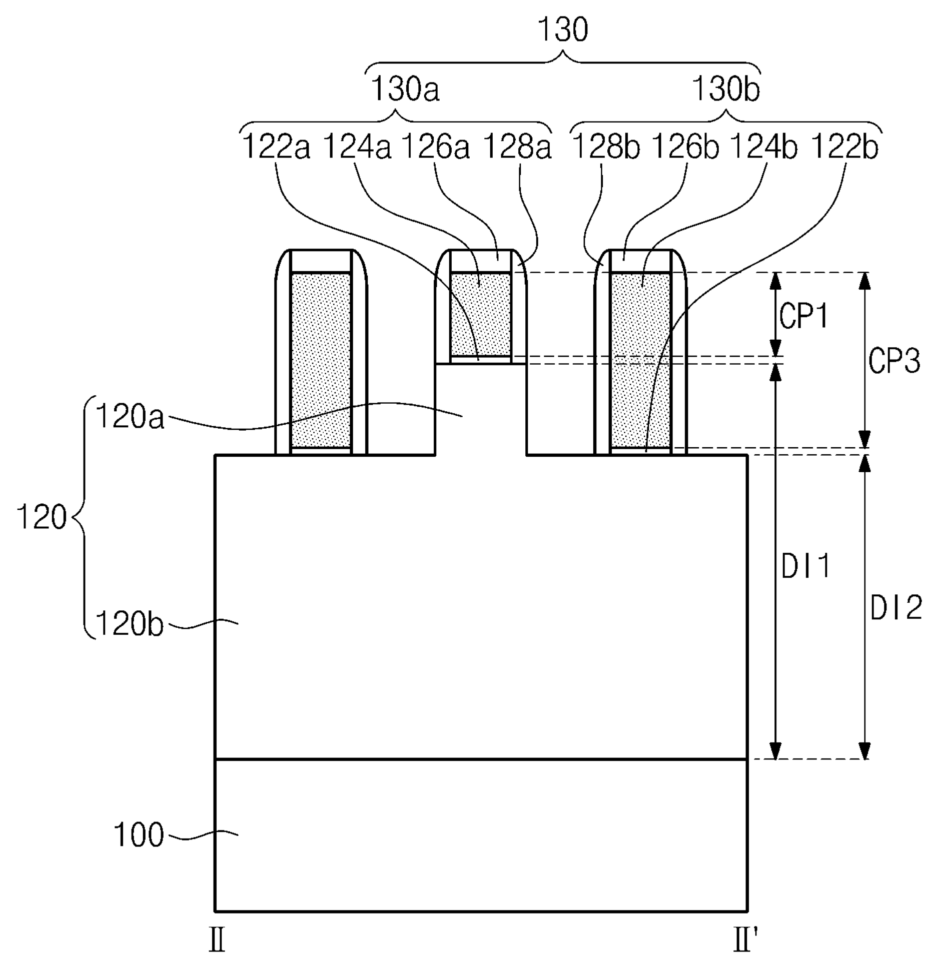
Figure 1D:
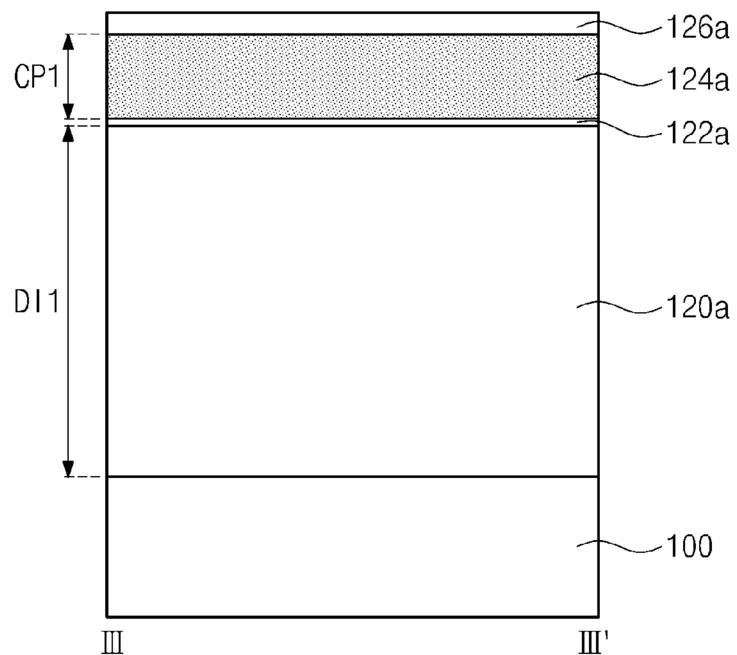
Figure 1E:
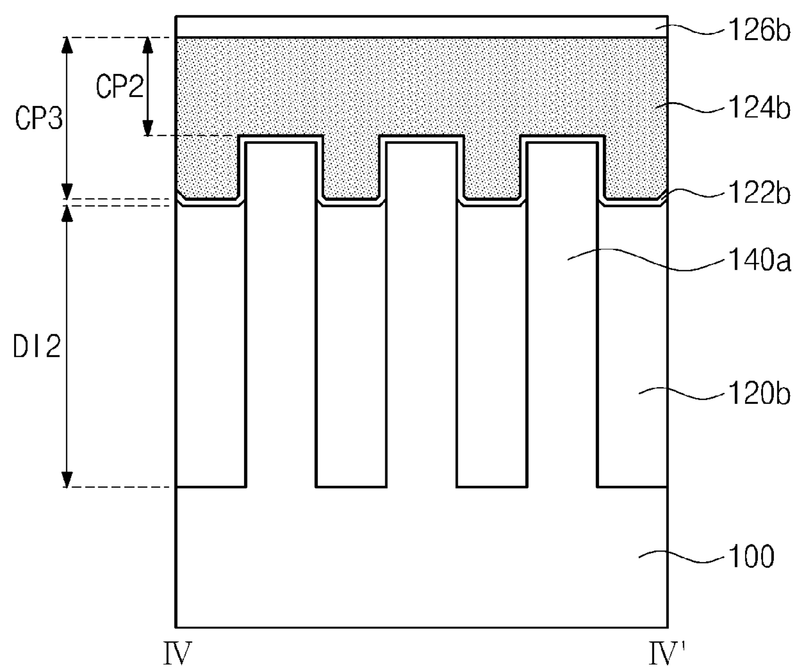
Figure 1F:
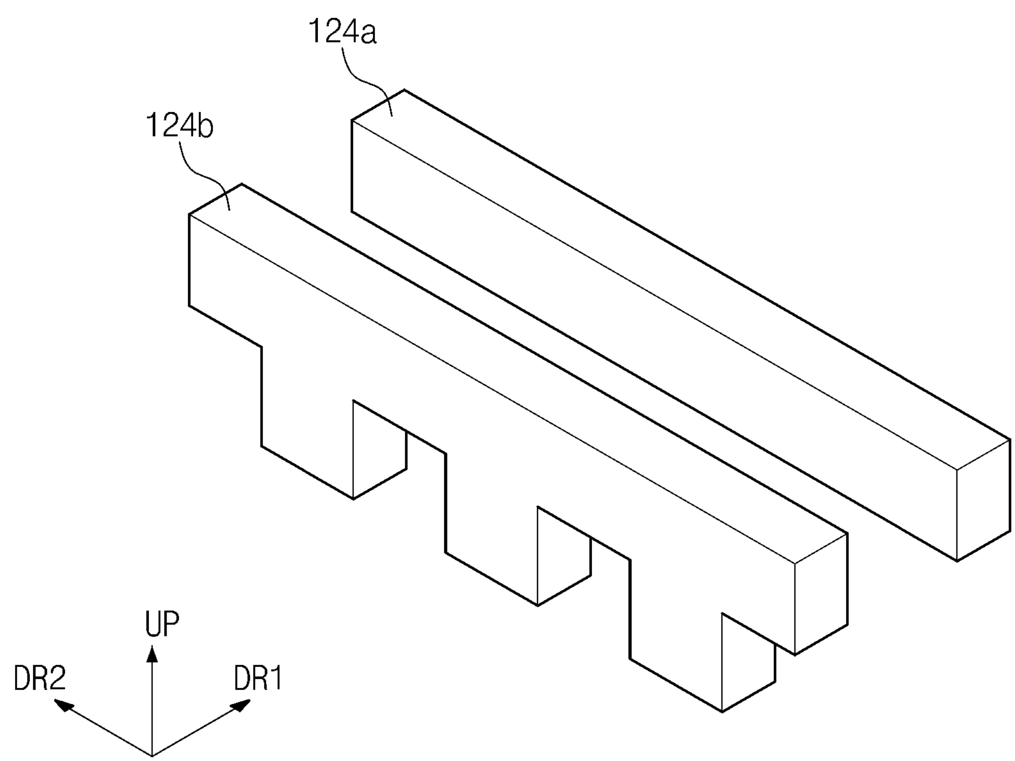
FIG. 1F is an exemplary perspective view of line patterns 124*a* and 124*b* shown in FIGS. 1D and 1E.

FIG. 1A is a plan view illustrating a semiconductor device according to some embodiments of the inventive concepts. FIG. 1B is a cross-sectional view taken along a line I-I' of FIG. 1A, and FIG. 1C is a cross-sectional view taken along a line II-II' of FIG. 1A. FIG. 1D is a cross-sectional view taken along a line of FIG. 1A, and FIG. 1E is a cross-sectional view taken along a line IV-IV' of FIG. 1A. FIG. 1F is an exemplary perspective view of line patterns 124*a* and 124*b* shown in FIGS. 1D and 1E.

Referring to FIGS. 1A through 1F, a semiconductor device may include a substrate 100, a fin-type active pattern 140, a device isolation pattern 120, a pattern structure 130, and a dopant pattern 150.

The substrate 100 may include a bulk silicon substrate or a silicon-on-insulator (SOI) substrate. Alternatively, the substrate 100 may include another semiconductor material, for example, silicon-germanium (SiGe), indium antimonide (InSb), lead telluride, indium arsenide (InAs), indium phosphide (InP), gallium arsenide (GaAs), or gallium antimonide (InSb). In still other embodiments, the substrate 100 may include a base substrate and an epitaxial layer formed on the base substrate.

The fin-type active pattern 140 may protrude from the substrate 100. The fin-type active pattern 140 may include a first active region 140*a* protruding from the substrate 100 by a first thickness AC1, and a second active region 140*b* protruding from the substrate 100 by a second thickness AC2 smaller than the first thickness AC1. The second active regions 140*b* may be disposed at both sides of the first active region 140*a*. The first active region 140*a* may overlap with the pattern structure 130, and the second active region 140*b* may overlap with the dopant pattern 150.

In some embodiments, the fin-type active pattern 140 may be a portion of the substrate 100. In other embodiments, the fin-type active pattern 150 may include an epitaxial layer grown from the substrate 100.

As illustrated in FIG. 1A, the fin-type active pattern 140 may have a rectangular shape extending in a first direction DR1 when viewed from a plan view. The fin-type active pattern 140 may be provided in plural. In this case, the fin-type active patterns 140 may be two-dimensionally arranged to constitute rows and columns when viewed from a plan view. The rows may be parallel to a second direction DR2 perpendicular to the first direction DR1, and the columns may be parallel to the first direction DR1. The fin-type active patterns 140 may be spaced apart from each other in the first direction DR1 and the second direction DR2. The fin-type active patterns 140 constituting each row may be spaced apart from each other in the second direction DR2, and the fin-type active patterns 140 constituting each column may be spaced apart from each other in the first direction DR1.

The device isolation pattern 120 may fill spaces between the fin-type active patterns 140. The device isolation pattern 120 may include a first device isolation region 120*a* filling a space between the fin-type active patterns 140 spaced apart from each other in the first direction DR1, and a second device isolation region 120*b* filling a space between the fin-type active patterns 140 spaced apart from each other in the second direction DR2. The first device isolation region 120*a* may have a first thickness DI1 from a top surface of the substrate 100, and the second device isolation region 120*b* may have a second thickness DI2 smaller than the first thickness DI1 from the top surface of the substrate 100. In detail, the top surface of the first device isolation region 120*a* may be disposed at a substantially same level as or a higher level than the top surface of the first active region 140*a*. More specifically, in some embodiments, the top surface of the first device isolation region 120*a* is higher than the top surface of the substrate structure adjacent to the first device isolation region 120*a* as shown in FIG. 1B, and the height difference is, for example, more than 30 angstroms (e.g., between 30 and 50 angstroms). The top surface of the second device isolation region 120*b* may be lower than the top surface of the first active region 140*a*. In some embodiments, the height difference between the top surface of the second device isolation region 120*b* and the top surface of the first active region 140*a* is more than 5 times bigger than the height difference between the top surface of the first device isolation region 120*a* and the top surface of the substrate structure adjacent to the first device isolation region 120*a*. For example, the height difference between the top surface of the first device isolation region 120*a* and the top surface of the substrate structure adjacent to the first device isolation region 120*a* may be between 5% and 20% of the height difference between the top surface of the second device isolation region 120*b* and the top surface of the first active region 140*a*. The device isolation pattern 120 may include, for example, an oxide, a nitride, and/or an oxynitride.

The pattern structure 130 may have a linear shape crossing over the fin-type active patterns 140. For example, the pattern structure 130 may extend in the second direction DR2. The pattern structure 130 may be provided in plural. In this case, the pattern structures 130 may be spaced apart from each other in the first direction DR1.

The pattern structures 130 may include insulating patterns 122*a* and 122*b*, line patterns 124*a* and 124*b*, and spacers 128*a* and 128*b*. The line patterns 124*a* and 124*b* may extend in the second direction DR2. The line patterns 124*a* and 124*b* may include, for example, silicon (Si) or silicon-germanium (SiGe). Alternatively, the line patterns 124*a* and 124*b* may include a metal or a metal compound. For example, the line patterns 124*a* and 124*b* may include at least one of titanium nitride (TiN), tantalum nitride (TaN), titanium carbide (TiC), tantalum carbide (TaC), tungsten (W), or aluminum (Al).

The insulating patterns 122*a* and 122*b* may be disposed between the fin-type active patterns 140 and the line patterns 124*a* and 124*b*. The insulating patterns 122*a* and 122*b* may also be disposed between the device isolation pattern 120 and the line patterns 124*a* and 124*b*. The insulating patterns 122*a* and 122*b* may extend in the second direction DR2. The insulating patterns 122*a* and 122*b* may include, for example, silicon oxide ($Si_xO_y$). In other embodiments, the insulating patterns 122*a* and 122*b* may include a high-k dielectric material having a dielectric constant higher than that of silicon oxide. For example, the insulating patterns 122*a* and 122*b* may include at least one of, but not limited to, hafnium oxide, hafnium-silicon oxide, lanthanum oxide, lanthanum-aluminum oxide, zirconium oxide, zirconium-silicon oxide, tantalum oxide, titanium oxide, barium-strontium-titanium oxide, barium-titanium oxide, strontium-titanium oxide, yttrium oxide, aluminum oxide, lead-scandium-tantalum oxide, or lead-zinc niobate.

The spacers 128*a* and 128*b* may be disposed on sidewalls of the line patterns 124*a* and 124*b* and the insulating patterns 122*a* and 122*b*. The spacers 128*a* and 128*b* may include a nitride and/or an oxynitride.

The pattern structures 130 may further include mask patterns 126*a* and 126*b*. The mask patterns 126*a* and 126*b* may be disposed on the line patterns 124*a* and 124*b*, respectively, and may extend in the second direction DR2. The mask patterns 126*a* and 126*b* may include a nitride and/or an oxynitride.

According to some embodiments of the inventive concepts, the pattern structures 130 may include a first pattern structure 130*a* extending in the second direction DR2 on the first device isolation region 120*a*, and a second pattern structure 130*b* extending in the second direction DR2 on the first active region 140*a* and the second device isolation region 120*b*. The first pattern structure 130*a* may include a first insulating pattern 122*a*, a first line pattern 124*a*, and a first spacer 128*a*. The first line pattern 124*a* may have a first thickness CP1 (in a vertical direction) which is substantially uniform. In other embodiments, the first pattern structure 130*a* may not include the first insulating pattern 122*a*. In some embodiments, the first pattern structure 130*a* is referred to as a first gate structure, and the first line pattern 124*a* is referred to as a first gate electrode.

The second pattern structure 130*b* may include a second insulating pattern 122*b*, a second line pattern 124*b*, and a second spacer 128*b*. The second line pattern 124*b* may have a second thickness CP2 (in a vertical direction) on the first active region 140*a* and may have a third thickness CP3 on the second device isolation region 120*b*. The first thickness CP1 of the first line pattern 124*a* may be substantially equal to the second thickness CP2 of the second line pattern 124*b*. The third thickness CP3 of the second line pattern 124*b* may be greater than the second thickness CP2 of the second line pattern 124*b*. FIG. 1F shows a perspective view of the first and the second line patterns 124*a* and 124*b* for a better understanding of the structures.

The top surface of the first pattern structure 130*a* may be disposed at a substantially same level as the top surface of the second pattern structure 130*b*.

In some embodiments, the second line pattern 124*b* of the second pattern structure 130*b* may function as a gate electrode. In this case, the second line pattern 124*b* on the second device isolation region 120*b* may have a sufficient thickness, so that the electrical resistance of a completed transistor may be reduced. The pattern structures described herein may also be referred to as gate structures. For example, the second pattern structure 130*b* may be referred to as a second gate structure, and the first pattern structure 130*a* may be referred to as a first gate structure. The second line pattern 124*b* may be referred to as a second gate electrode. The pattern structure 130 or other groups of gate structures may also be referred to as a gate pattern.

The dopant pattern 150 may be disposed on the second active region 140*b* of the active pattern 140. In some embodiments, the semiconductor device includes a PMOS fin-type transistor, and the dopant pattern 150 may include a material capable of providing a compressive stress (hereinafter, referred to as 'a compressive stress material). The compressive stress material may have a lattice constant greater than that of silicon (Si). For example, the compressive stress material may be silicon-germanium (SiGe). The compressive stress material may provide the fin-type active pattern 140 with a compressive stress to improve the mobility of carriers of a channel area. Additionally, the dopant pattern 150 may further include boron (B). The dopant pattern 150 may further include carbon (C) capable of suppressing diffusion of the boron.

In other embodiments, the semiconductor device includes an NMOS fin-type transistor, and the dopant pattern 150 may include the same semiconductor material as the fin-type active pattern 140 or a material capable of providing a tensile stress (hereinafter, referred to as 'a tensile stress material'). For example, the dopant pattern 150 may include silicon or a material having a lattice constant smaller than that of silicon, for example, silicon carbide (SiC). The dopant pattern 150 may include phosphorus (P) and/or arsenic (As) as dopants.

Figure 2A:
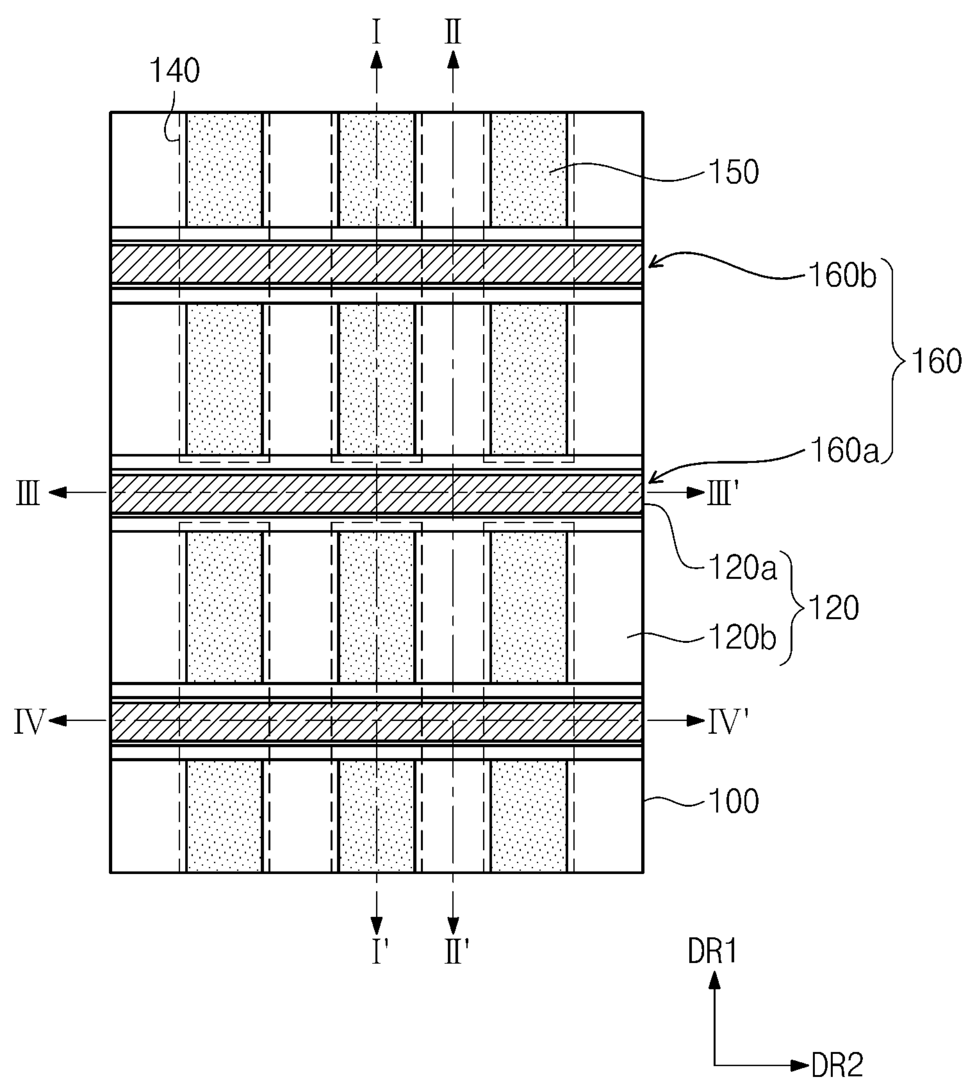
FIG. 2A is a plan view illustrating a semiconductor device according to other embodiments of the inventive concepts.
Figure 2B:
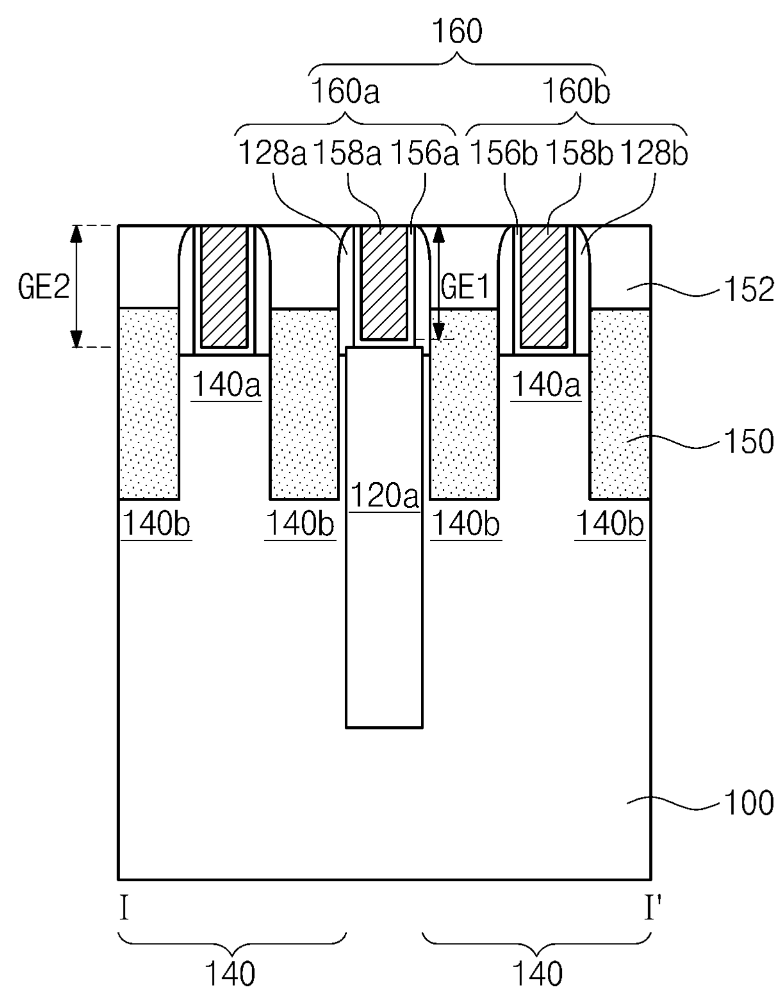
FIGS. 2B, 2C, 2D, and 2E are cross-sectional views taken along lines I-I', and IV-IV' of FIG. 2A, respectively.
Figure 2C:
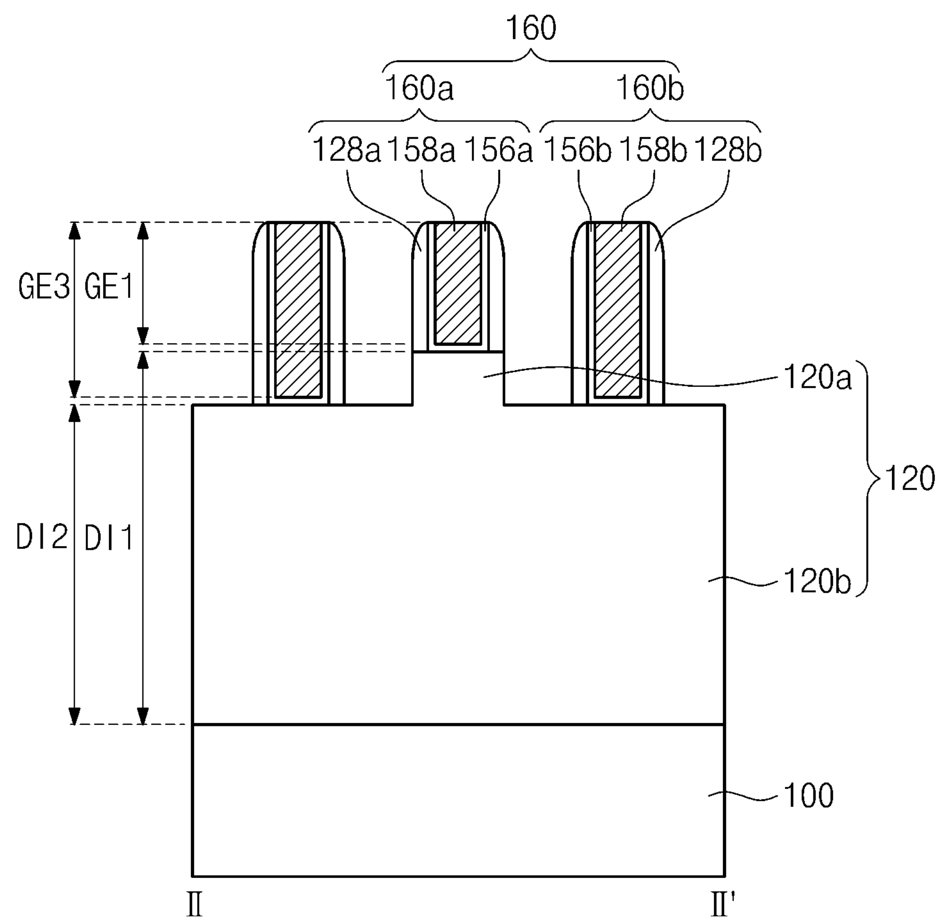
Figure 2D:
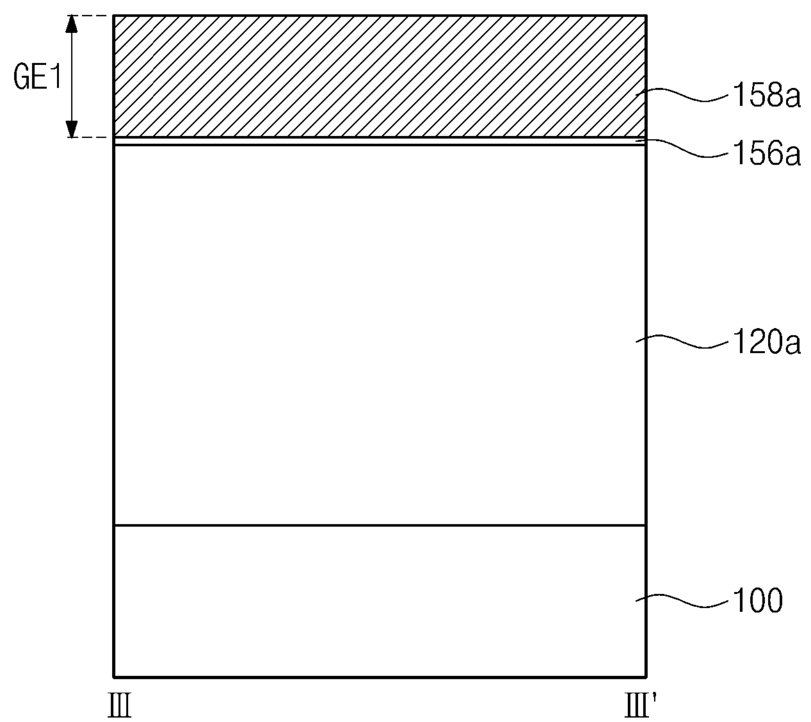
Figure 2E:
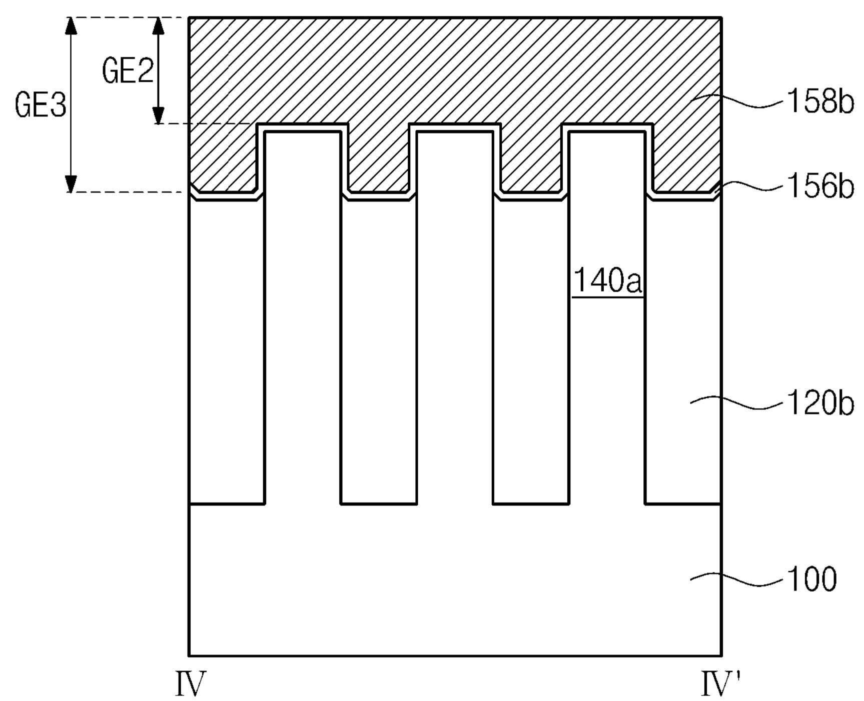
Figure 3A:
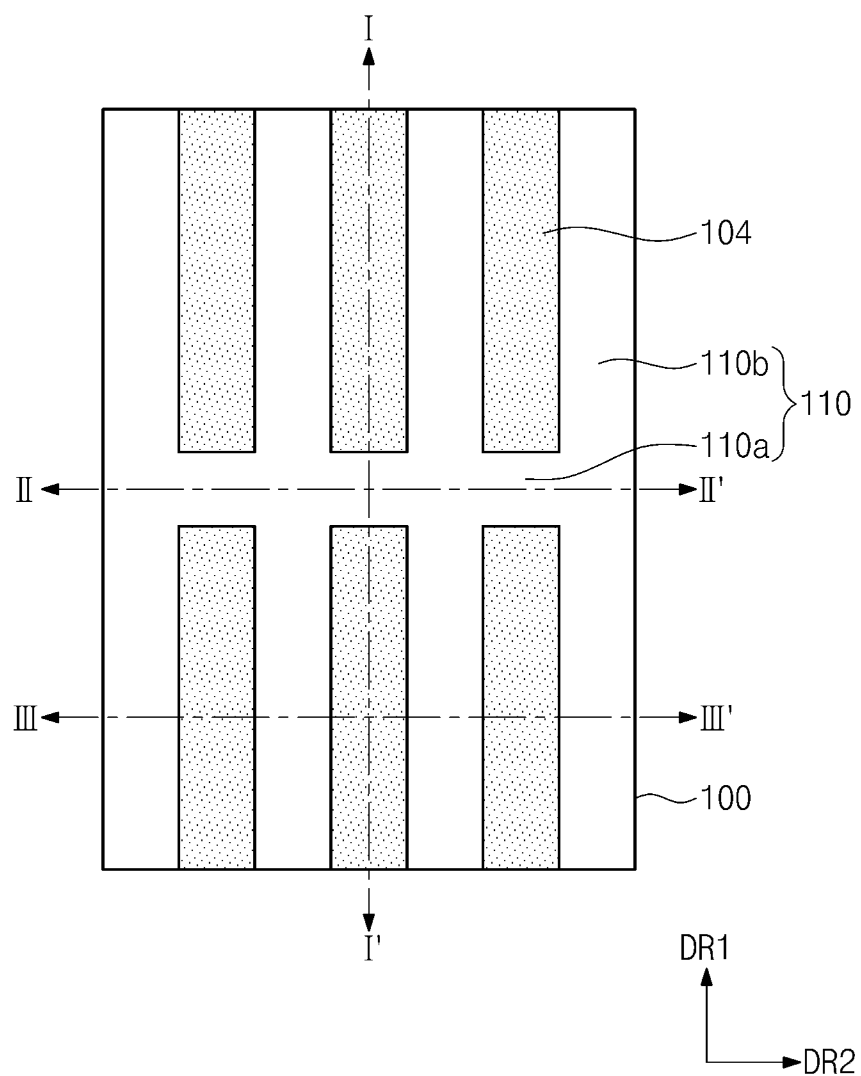
Figure 3B:
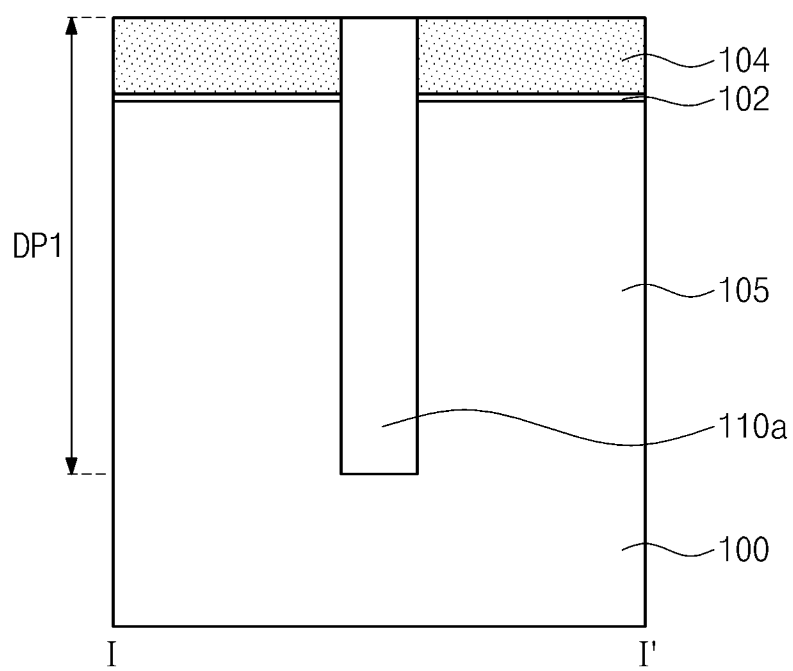
Figure 3C:
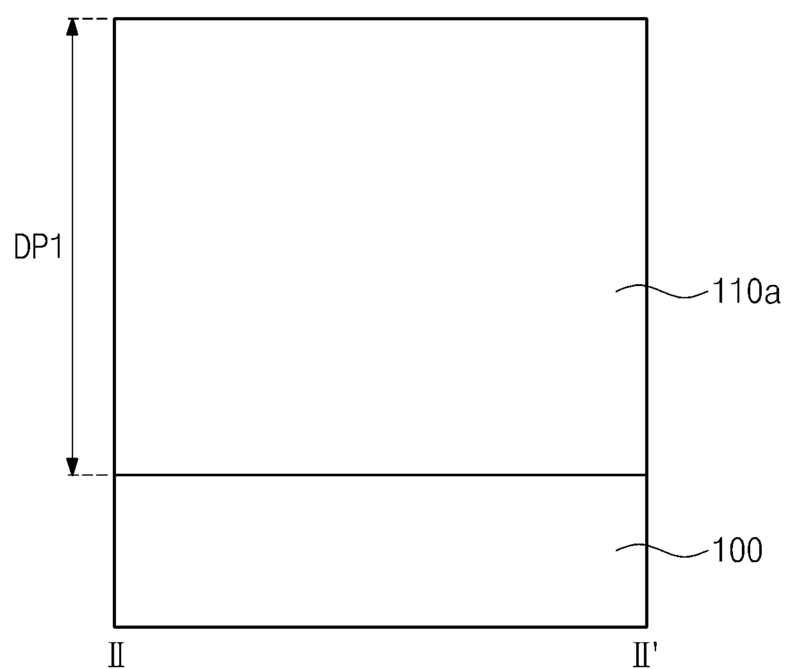
Figure 3D:
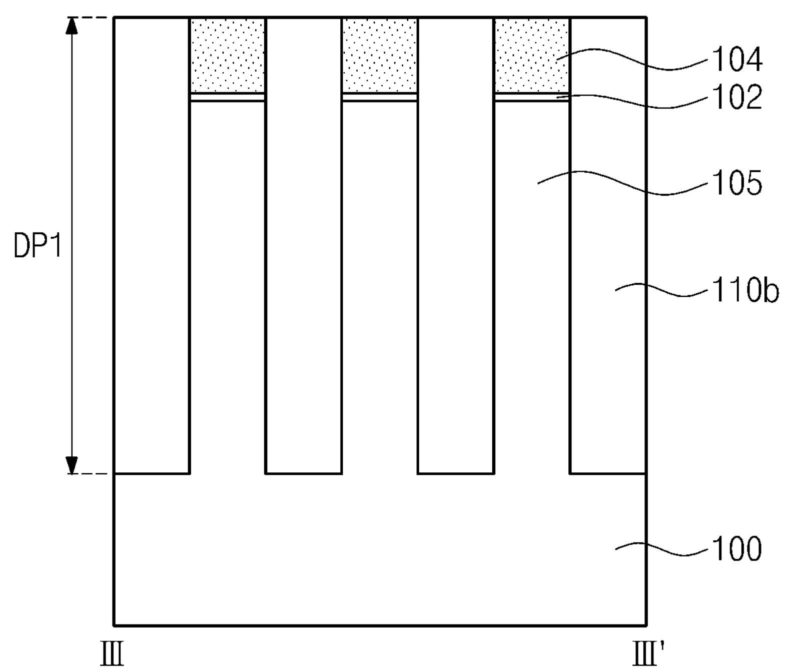
Figure 4A:
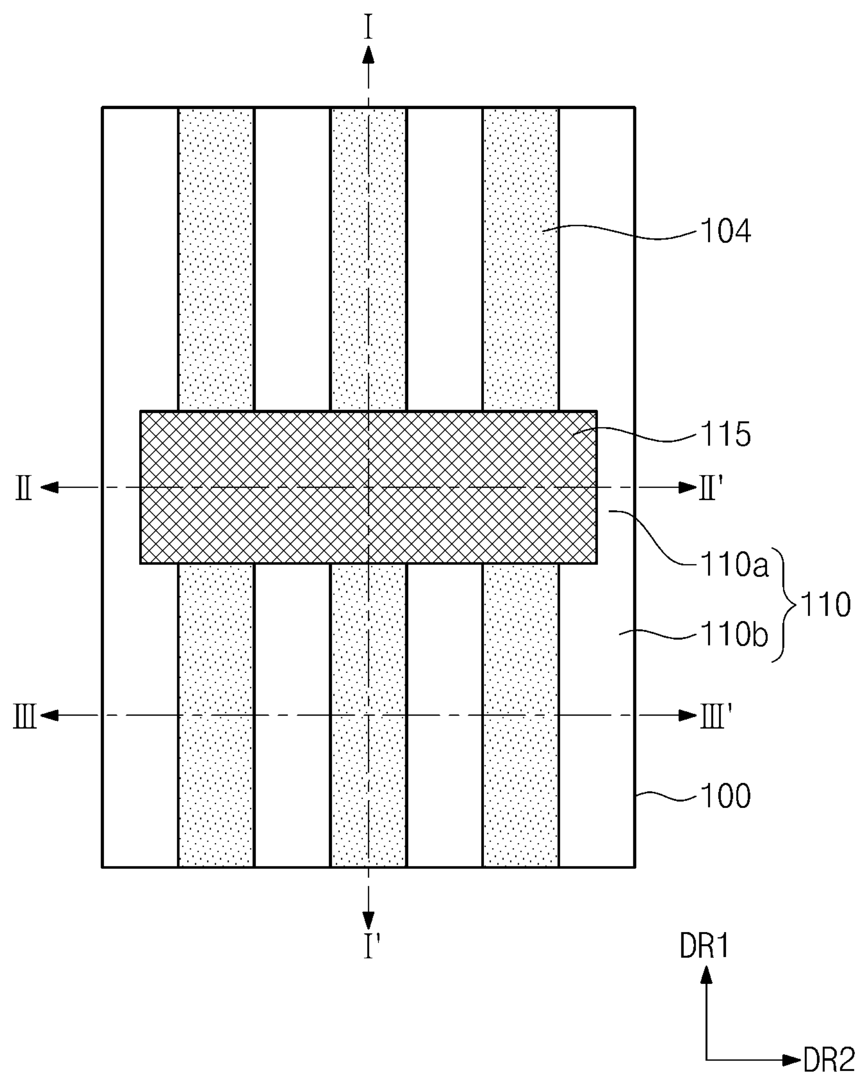
Figure 4B:
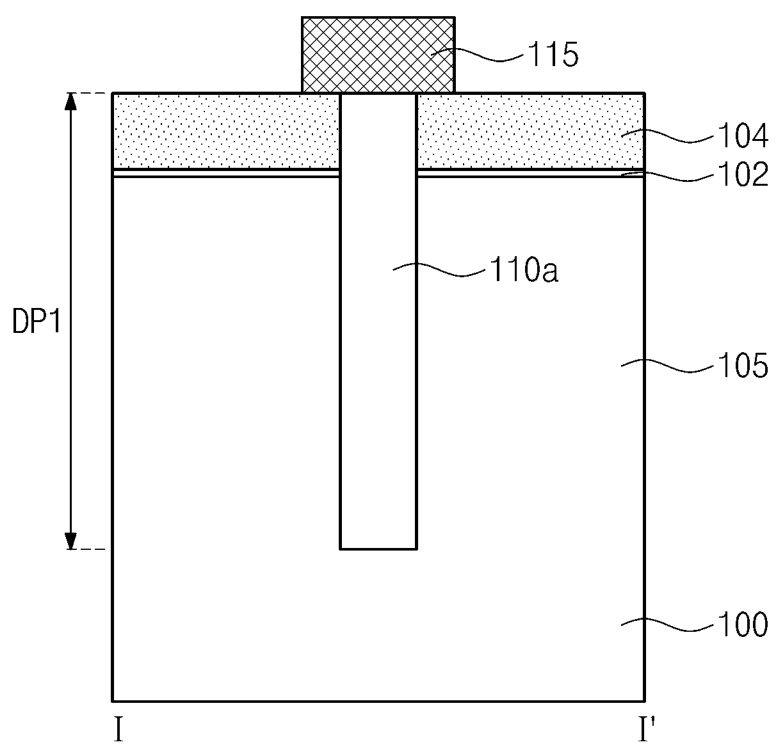
Figure 4C:
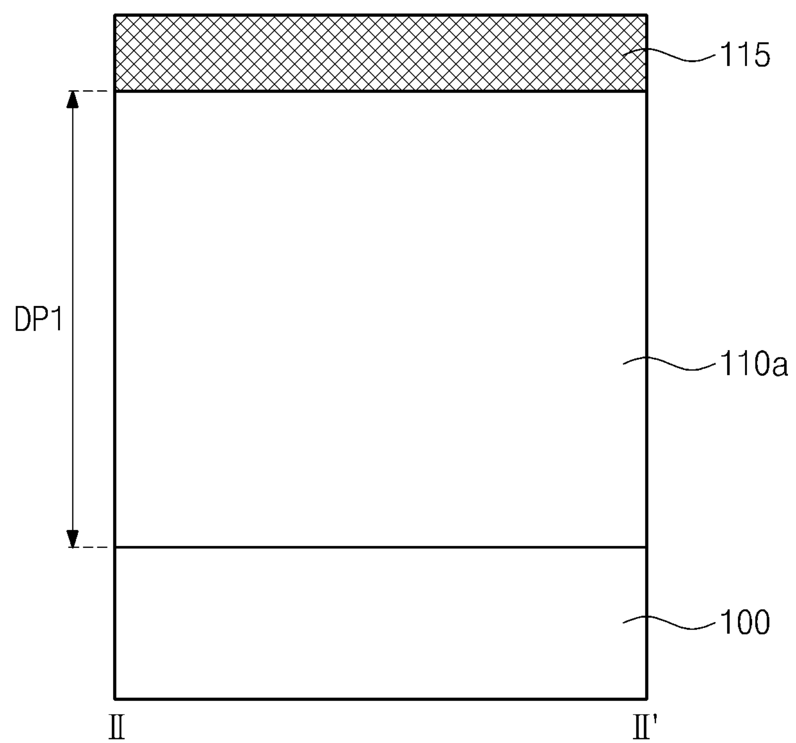
Figure 4D:
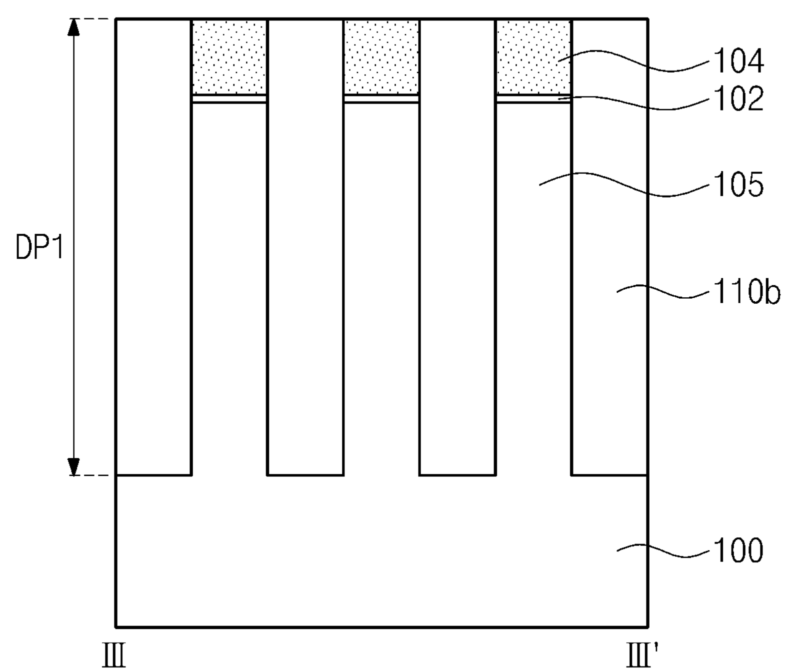
Figure 5A:
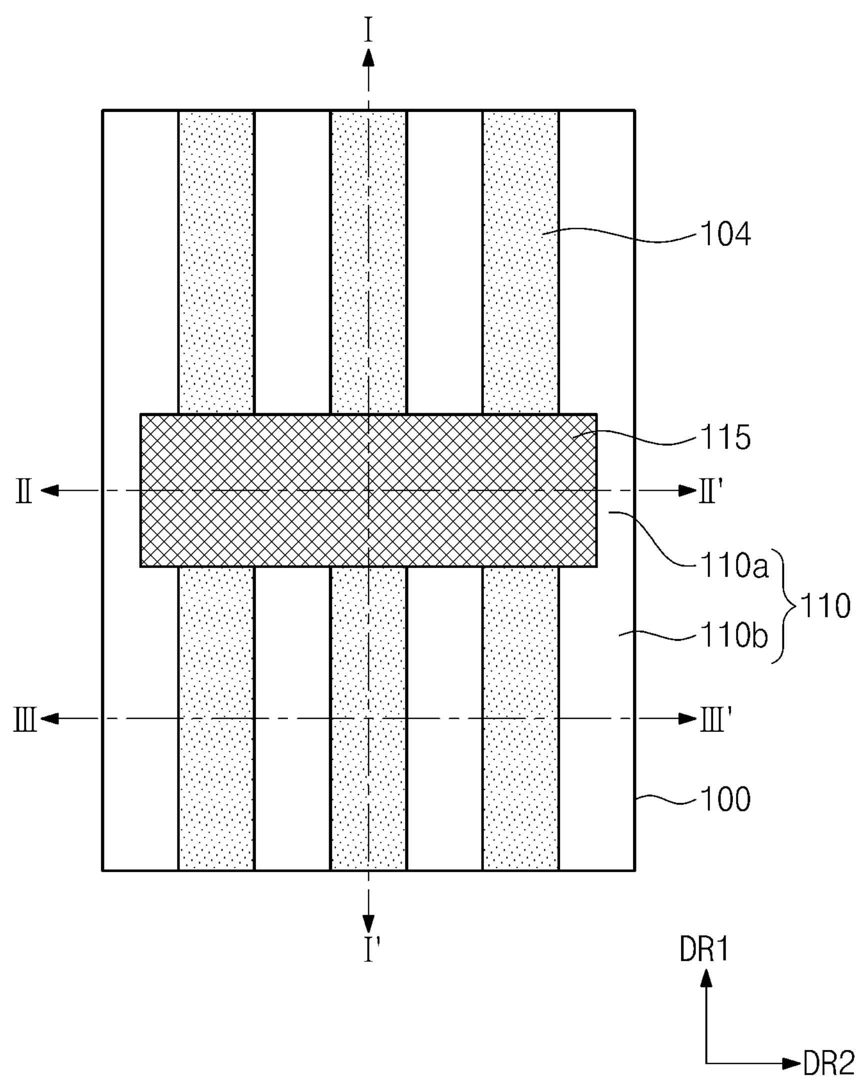
Figure 5B:
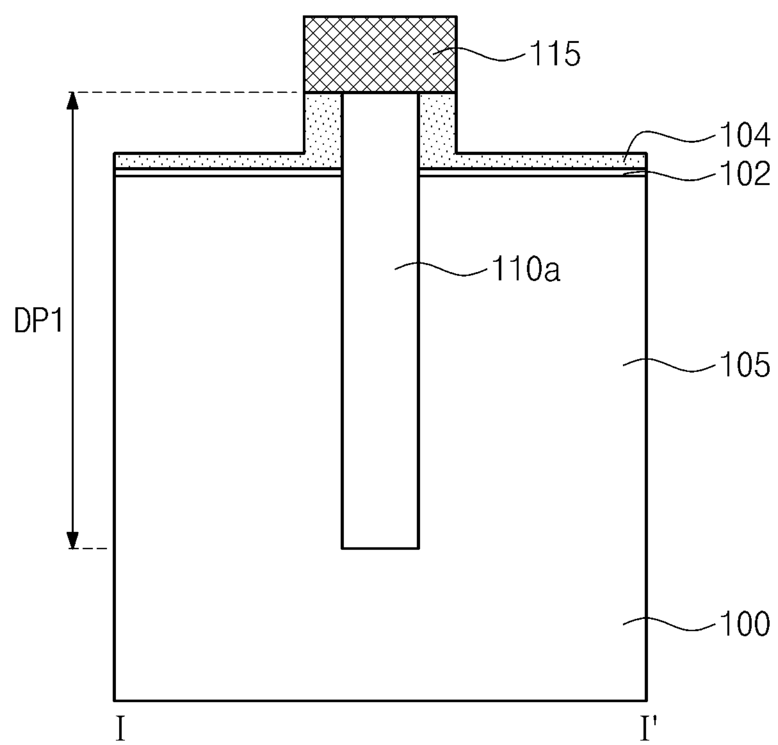
Figure 5C:
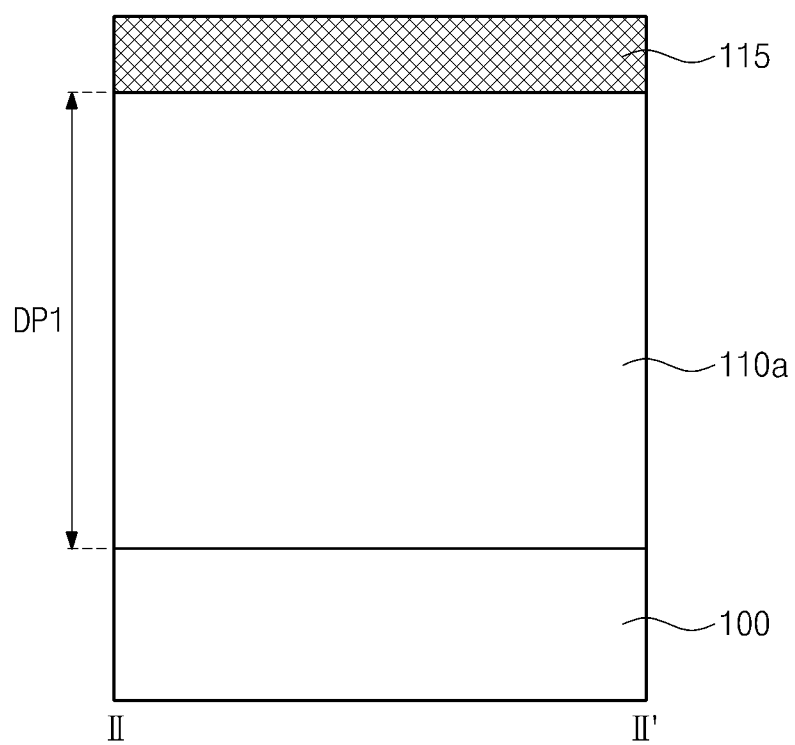
Figure 5D:
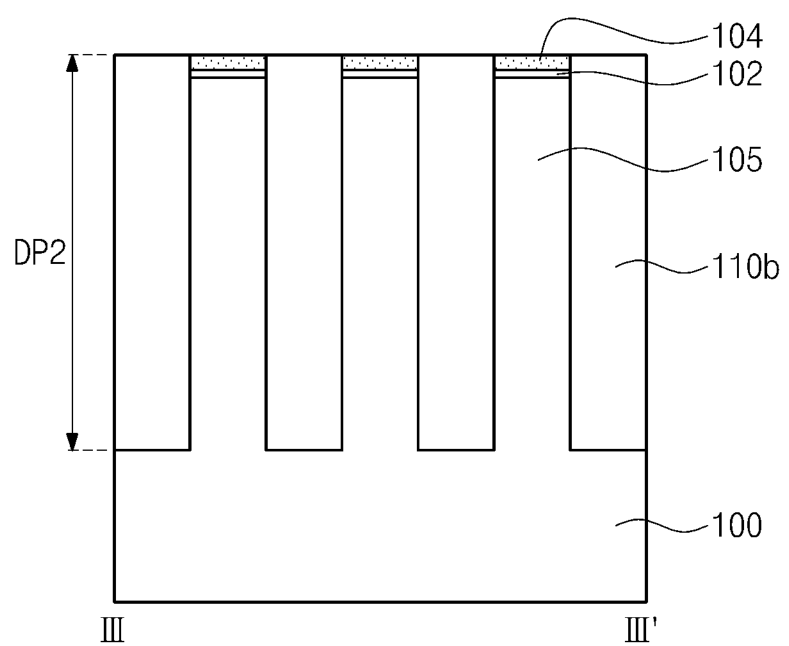
Figure 6A:
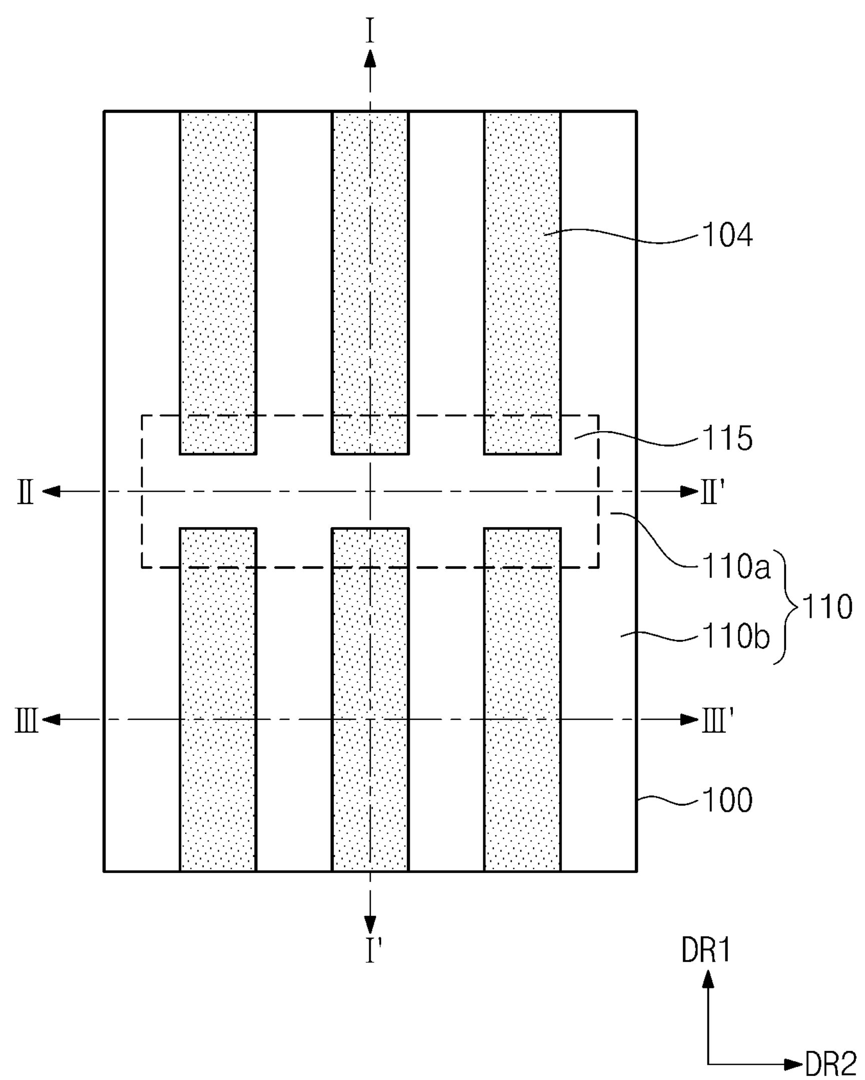
Figure 6B:
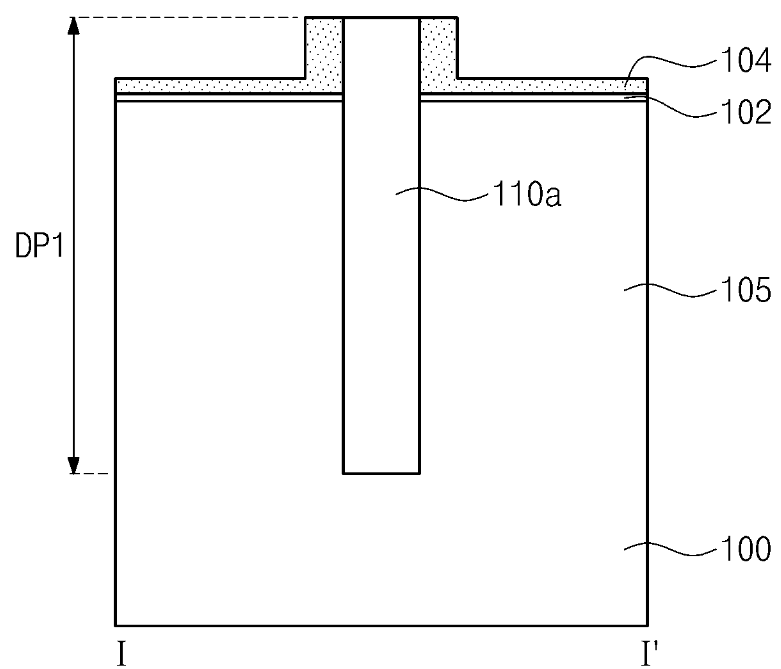
Figure 6C:
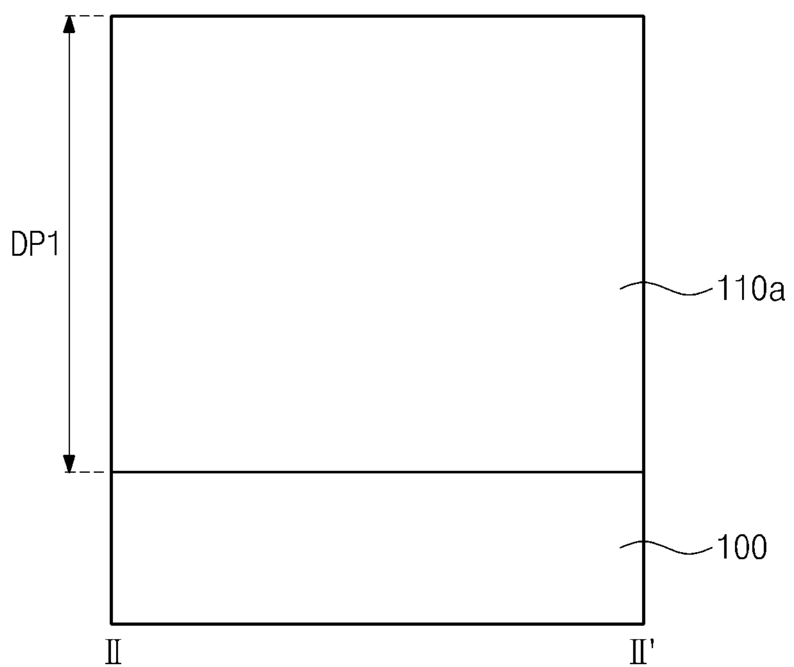
Figure 6D:
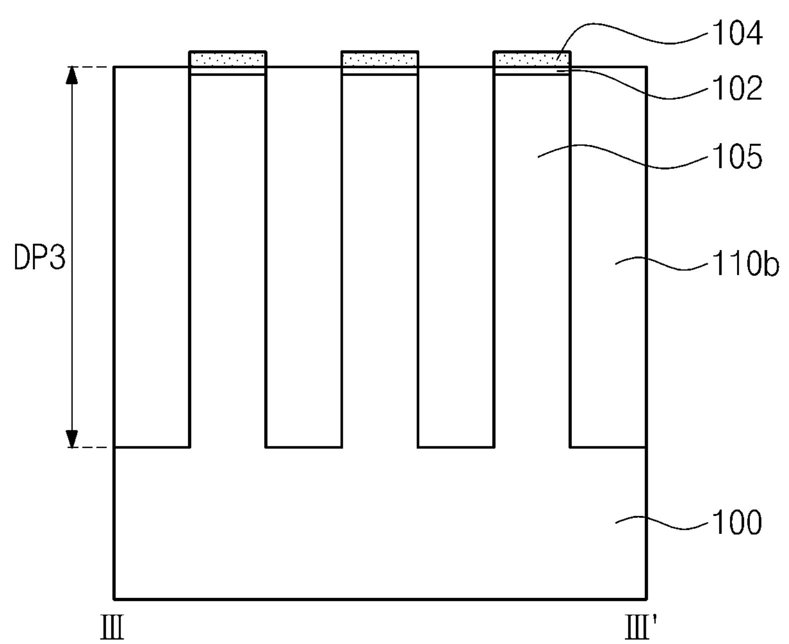
Figure 7A:
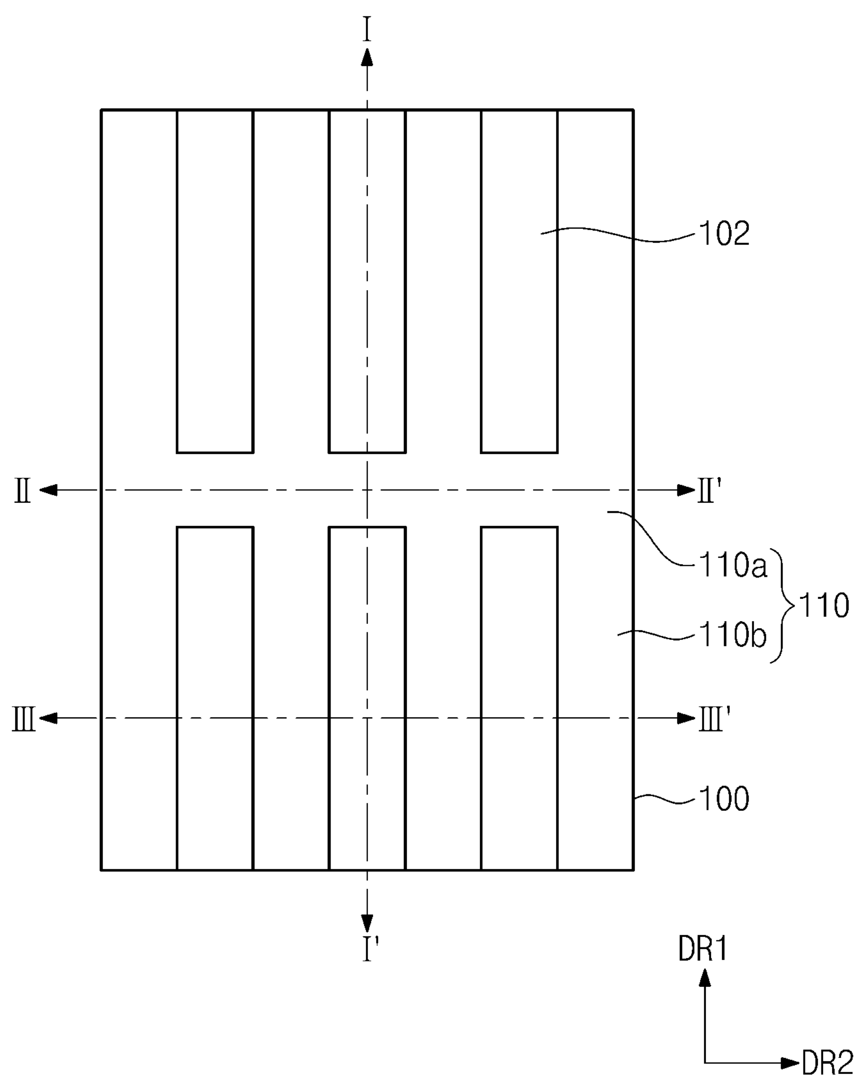
Figure 7B:
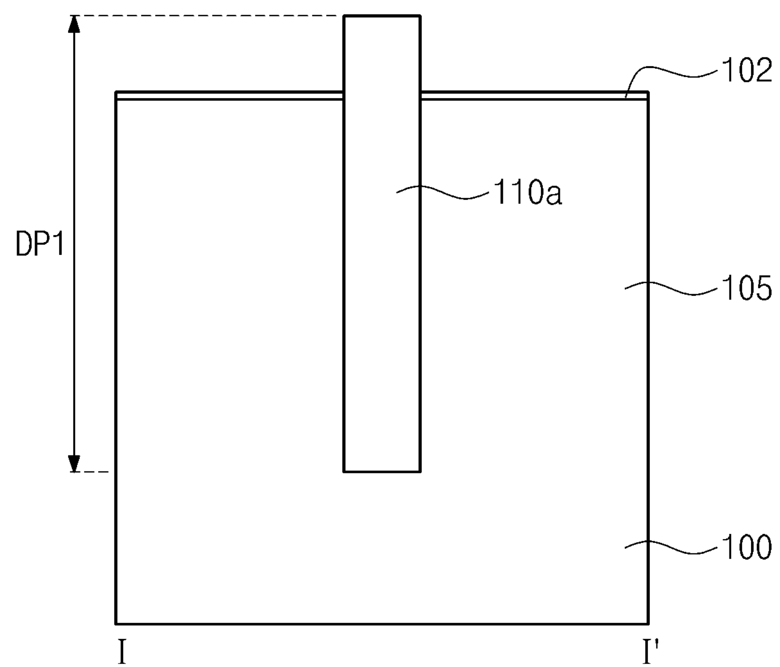
Figure 7C:
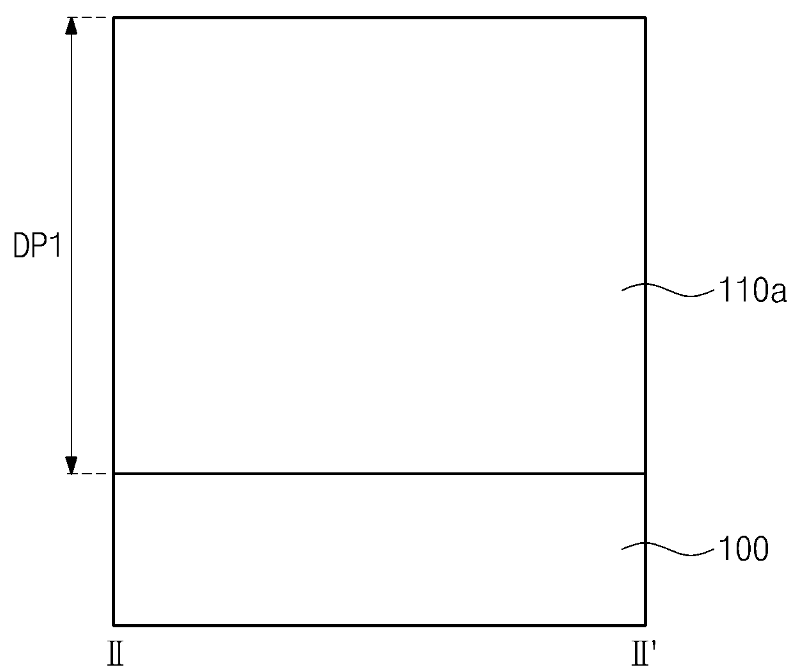
Figure 7D:
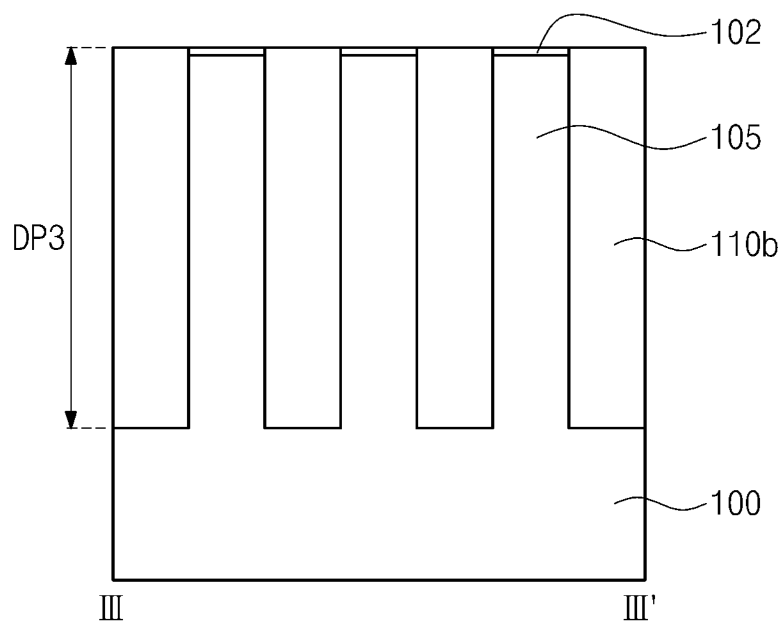

FIG. 2A is a plan view illustrating a semiconductor device according to other embodiments of the inventive concepts. FIG. 2B is a cross-sectional view taken along a line I-I' of FIG. 2A, and FIG. 2C is a cross-sectional view taken along a line II-II' of FIG. 2A. FIG. 2D is a cross-sectional view taken along a line of FIG. 2A, and FIG. 2E is a cross-sectional view taken along a line IV-IV' of FIG. 2A.

Referring to FIGS. 2A through 2E, a semiconductor device may include a substrate 100, a fin-type active pattern 140, a device isolation pattern 120, a gate structure 160, and a dopant pattern 150.

The gate structure 160 may extend in the second direction DR2 to cross over the fin-type active pattern 140. Additionally, the gate structure 160 may be provided in plural. In this case, the gate structures 160 may be spaced apart from each other in the first direction DR1.

The gate structures 160 may include gate insulating patterns 156*a* and 156*b*, gate electrodes 158*a* and 158*b*, and spacers 128*a* and 128*b*.

Each of the gate electrodes 158*a* and 158*b* may have a multi-layered structure. In some embodiments, each of the gate electrodes 158*a* and 158*b* has a two-layered structure, and the lower gate electrode (not shown) may include a conductive material capable of controlling a work function. For example, the lower gate electrode may include at least one of titanium nitride (TiN), tantalum nitride (TaN), titanium carbide (TiC), or tantalum carbide (TaC). The upper gate electrode (not shown) may include at least one of tungsten (W) and aluminum (Al).

Each of the gate insulating patterns 156*a* and 156*b* may have a structure surrounding a sidewall and a bottom surface of each of the gate electrodes 158*a* and 158*b* and may extend in the second direction DR2. In some embodiments, the gate insulating patterns 156*a* and 156*b* may include silicon oxide ($Si_xO_y$). In other embodiments, the gate insulating patterns 156*a* and 156*b* may include a high-k dielectric material having a dielectric constant higher than that of silicon oxide. For example, the gate insulating patterns 156*a* and 156*b* may include at least one of, but not limited to, hafnium oxide, hafnium-silicon oxide, lanthanum oxide, lanthanum-aluminum oxide, zirconium oxide, zirconium-silicon oxide, tantalum oxide, titanium oxide, barium-strontium-titanium oxide, barium-titanium oxide, strontium-titanium oxide, yttrium oxide, aluminum oxide, lead-scandium-tantalum oxide, or lead-zinc niobate.

In some embodiments, the line patterns 124*a* and 124*b* and the insulating patterns 122*a* and 122*b* of FIGS. 1A through 1E may be removed, and a replacement process may be then performed to form the gate electrodes 158*a* and 158*b* and the gate insulating patterns 156*a* and 156*b*.

The spacers 128*a* and 128*b* may be the same as the spacers 128*a* and 128*b* of FIGS. 1A through 1E, so the descriptions to the spacers 128*a* and 128*b* are omitted.

In some embodiments, the gate structures 160 may include a first gate structure 160*a* disposed on the first device isolation region 120*a*, and a second gate structure 160*b* disposed on the first active region 140*a* and the second device isolation region 120*b*. The first gate structure 160*a* may include a first gate insulating pattern 156*a*, a first gate electrode 158*a*, and a first spacer 128*a*. The first gate electrode 158*a* may have a first thickness GE1 which is substantially uniform. The second gate structure 160*b* may include a second gate insulating pattern 156*b*, a second gate electrode 158*b*, and a second spacer 128*b*. The second gate electrode 158*b* may have a second thickness GE2 on the first active region 140*a* and may have a third thickness GE3 on the second device isolation region 120*b*. The first thickness GE1 of the first gate electrode 158*a* may be substantially equal to the second thickness GE2 of the second gate electrode 158*b*. The third thickness GE3 of the second gate electrode 158*b* may be greater than the second thickness GE2 of the second gate electrode 158*b*. The perspective views of the respective first and second gate electrodes 158*a* and 158*b* are similar to the perspective views of the first and the second line patterns 124*a* and 124*b* shown in FIG. 1F. The top surface of the first gate structure 160*a* may be disposed at a substantially same level as the top surface of the second gate structure 160*b*.

The semiconductor device may further include an interlayer insulating layer 152 covering sidewalls of the gate structures 160. The top surface of the interlayer insulating layer 152 may be disposed at a substantially same height as the top surfaces of the gate structures 160. The interlayer insulating layer 152 may include an oxide, a nitride, and/or an oxynitride.

The substrate 100, the fin-type active pattern 140, the device isolation pattern 120, and the dopant pattern 150 may be the same as the substrate 100, the fin-type active pattern 140, the device isolation pattern 120, and the dopant pattern 150 of FIGS. 1A to 1E, so the descriptions thereof are omitted here.

FIGS. 3A through 11A are plan views illustrating a method of manufacturing a semiconductor device according to some embodiments of the inventive concepts. FIGS. 3B through 11B are cross-sectional views taken along lines I-I' of FIGS. 3A through 11A, respectively. FIGS. 3C through 11C are cross-sectional views taken along lines II-II' of FIGS. 3A through 11A, respectively. FIGS. 3D through 11D are cross-sectional views taken along lines of FIGS. 3A through 11A, respectively.

Referring to FIGS. 3A through 3D, a preliminary device isolation pattern 110 may be formed in the substrate 100 to define preliminary fin-type active patterns 105.

In detail, an insulating layer 102 may be formed on the substrate 100, and first mask patterns 104 may be then formed on the insulating layer 102. The insulating layer 102 may include silicon oxide, and the first mask patterns 104 may include a nitride (e.g., silicon nitride) and/or an oxynitride (e.g., silicon oxynitride). Each of the first mask patterns 104 may have a rectangular shape extending in a first direction DR1 when viewed from a plan view. In a plan view, the first mask patterns 104 may be two-dimensionally arranged to constitute rows and columns. The columns may be parallel to the first direction DR1, and the rows may be parallel to a second direction DR2 perpendicular to the first direction DR1. The first mask patterns 104 may be spaced apart from each other in the first direction DR1 and in the second direction DR2. For example, the first mask patterns 104 in each column may be spaced apart from each other in the first direction DR1, and the first mask patterns 104 in each row may be spaced apart from each other in the second direction DR2.

The substrate 100 may be etched by an etching process using the first mask patterns 104 as an etch mask to form a trench. An insulating material may be formed to fill the trench, and the insulating material may be then planarized, for example, until at least a top surface of the substrate 100 is exposed, thereby forming the preliminary device isolation pattern 110.

The preliminary device isolation pattern 110 defines the preliminary fin-type active patterns 105. Each of the preliminary fin-type active patterns 105 may have a rectangular shape extending in the first direction DR1. The preliminary fin-type active patterns 105 may be two-dimensionally arranged in a plan view to constitute rows and columns. The preliminary fin-type active patterns 105 in each row may be spaced apart from each other in the second direction DR2, and the preliminary fin-type active patterns 105 in each column may be spaced apart from each other in the first direction DR1.

For the purpose of ease and convenience in explanation, the preliminary device isolation pattern 110 between the preliminary fin-type active patterns 105 spaced apart from each other in the first direction DR1 is defined as a first region 110*a*, and the preliminary device isolation pattern 110 between the preliminary fin-type active patterns 105 spaced apart from each other in the second direction DR2 is defined as a second region 110*b*. Each of the first and second regions 110*a* and 110*b* may have a first thickness DP1 from the bottom surface of the trench.

Referring to FIGS. 4A through 4D, a second mask pattern 115 may be formed to cover the first region 110*a*. The second mask pattern 115 may include a photoresist pattern.

In some embodiments, the second mask pattern 115 may cover the first region 110*a* and portions of the preliminary fin-type active patterns 105 adjacent to the first region 110*a*.

Referring to FIGS. 5A through 5D, portions of the first mask patterns 104 and a portion of the second region 110*b*, which are exposed by the second mask pattern 115, may be etched using the second mask pattern 115 as an etch mask.

In some embodiments, the first mask patterns 104 may include a nitride, the second region 110*b* may include an oxide, and the second mask pattern 115 may include a photoresist. In this case, in the etching process, the etch rates of the nitride and the oxide may be equal or similar to each other. The etch rate of the photoresist may be less than those of the nitride and the oxide. For example, an etchant used in the etching process may include a carbon oxyfluoride ($CO_xF_y$)-based gas and/or butane octafluoride ($C_4F_8$).

A portion of the first mask pattern 104 may remain after the etching process. The top surface of the remaining first mask pattern 104 may be disposed at a substantially same height as the top surface of the etched second region 110*b*. The etched second region 110*b* may have a second thickness DP2 smaller than the first thickness DP1. Meanwhile, the first region 110*a* is protected by the second mask pattern 115 during the etching process, so the first region 110*a* may have the first thickness DP1 after the etching process.

Referring to FIGS. 6A through 6D, the second region 110*b* may be recessed.

In some embodiments, the second region 110*b* includes an oxide, and the recess process may use an etchant capable of selectively etching the oxide. For example, the etchant may include a carbon oxyfluoride ($CO_xF_y$)-based gas or butane octafluoride ($C_4F_8$). In some embodiments, the recessed thickness of the second region 110*b* may be substantially equal to the thickness of the remaining first mask pattern 104.

The recessed second region 110*b* may have a third thickness DP3 smaller than the second thickness DP2. The top surface of the recessed second region 110*b* may be lower than the top surface of the remaining first mask pattern 104. In some embodiments, the top surface of the recessed second region 110*b* may be disposed at a substantially same height as the top surface of the insulating layer 102.

When the second region 110*b* is recessed, the first region 110*a* may not be etched due to the second mask pattern 115. Thus, the first region 110*a* may still have the first thickness DP1 after the second region 110*b* is recessed.

Next, the second mask pattern 115 may be removed. In some embodiments, the second mask pattern 115 includes the photoresist, and the second mask pattern 115 may be removed by an ashing process and/or a strip process.

Referring to FIGS. 7A through 7D, the first mask patterns 104 may be removed.

In some embodiments, the first mask patterns 104 include a nitride, and the first mask patterns 104 may be removed by a phosphoric acid strip process. After the removal of the first mask patterns 104, the insulating layer 102 may be exposed.

As described above, the top surface of the second region 110*b* may be disposed at a substantially same height as the top surface of the insulating layer 102. The second region 110*b* may have the third thickness DP3. The first region 110*a* may have the first thickness DP1 and may protrude from the insulating layer 102.

In some embodiments, a doping process for controlling a threshold voltage may be performed on the preliminary fin-type active patterns 105. In some embodiments, a completed semiconductor element is an NMOS fin-type transistor, and dopants of the doping process may be boron (B). In some other embodiments, the completed semiconductor element is a PMOS fin-type transistor, and the dopants of the doping process may be phosphorus (P) or arsenic (As).

Referring to FIGS. 8A through 8D, an upper portion of the preliminary device isolation pattern 110 including the first and second regions 110*a* and 110*b* may be recessed to form a device isolation pattern 120. The device isolation pattern 120 may include a first device isolation region 120*a* and a second device isolation region 120*b*.

In some embodiments, the upper portion of the preliminary device isolation pattern 110 may be recessed by an isotropic dry etching process.

Figure 8A:
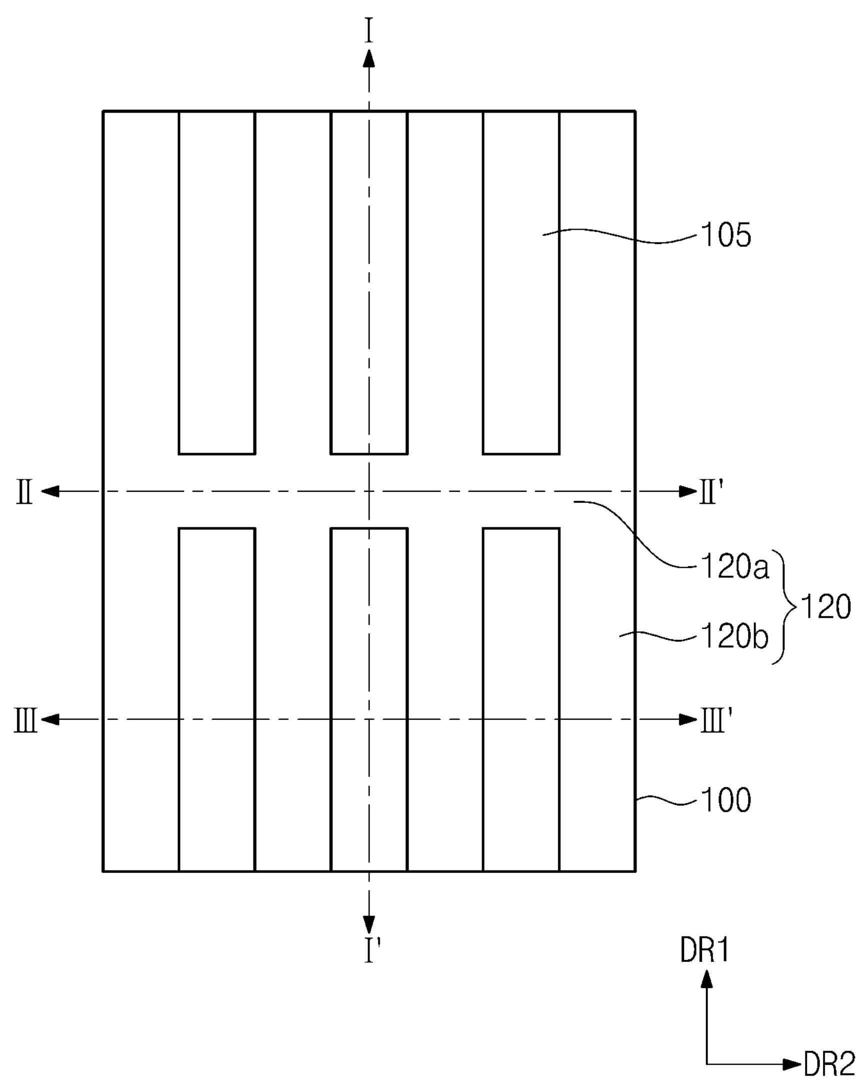
Figure 8B:
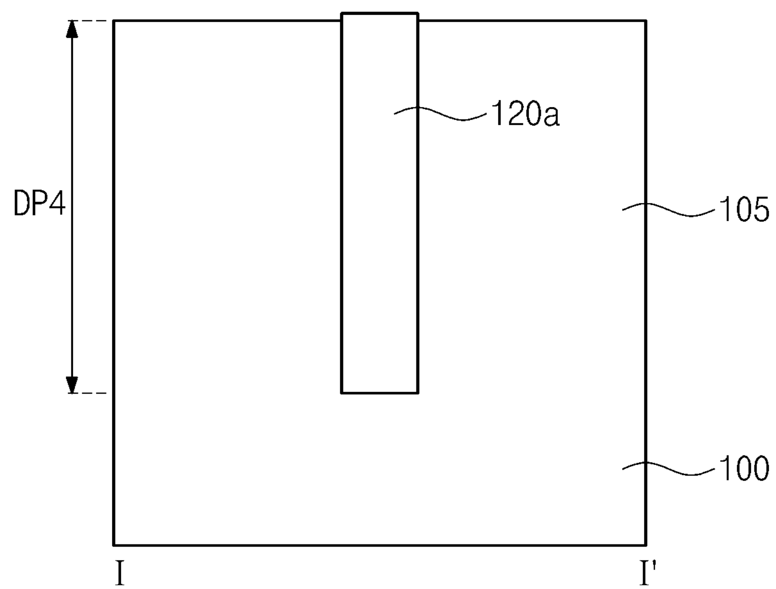
Figure 8C:
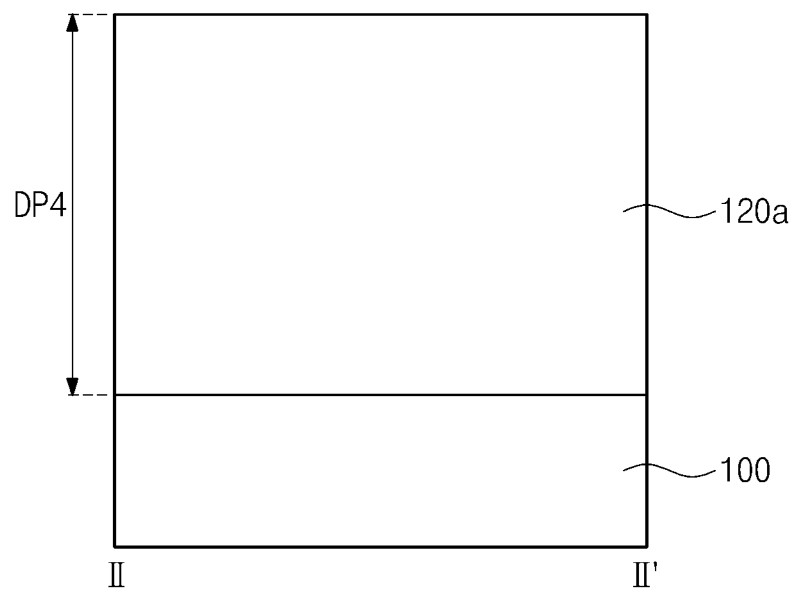
Figure 8D:
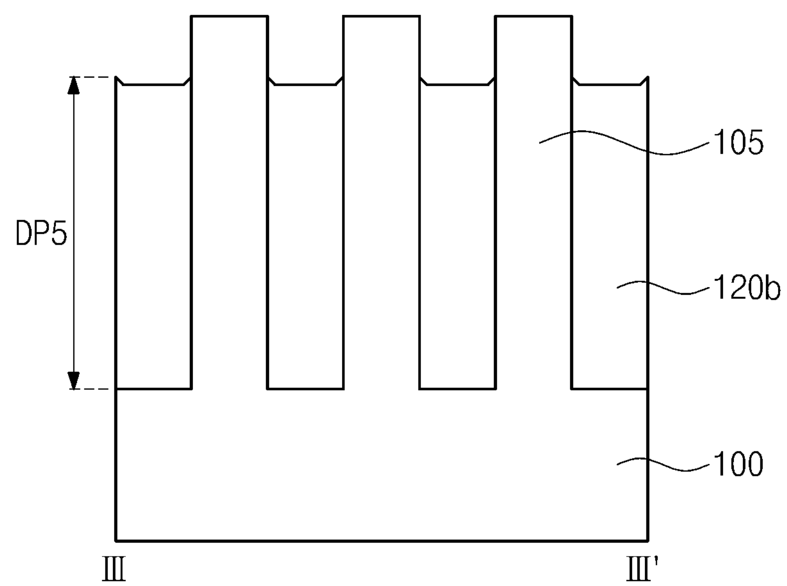
Figure 9A:
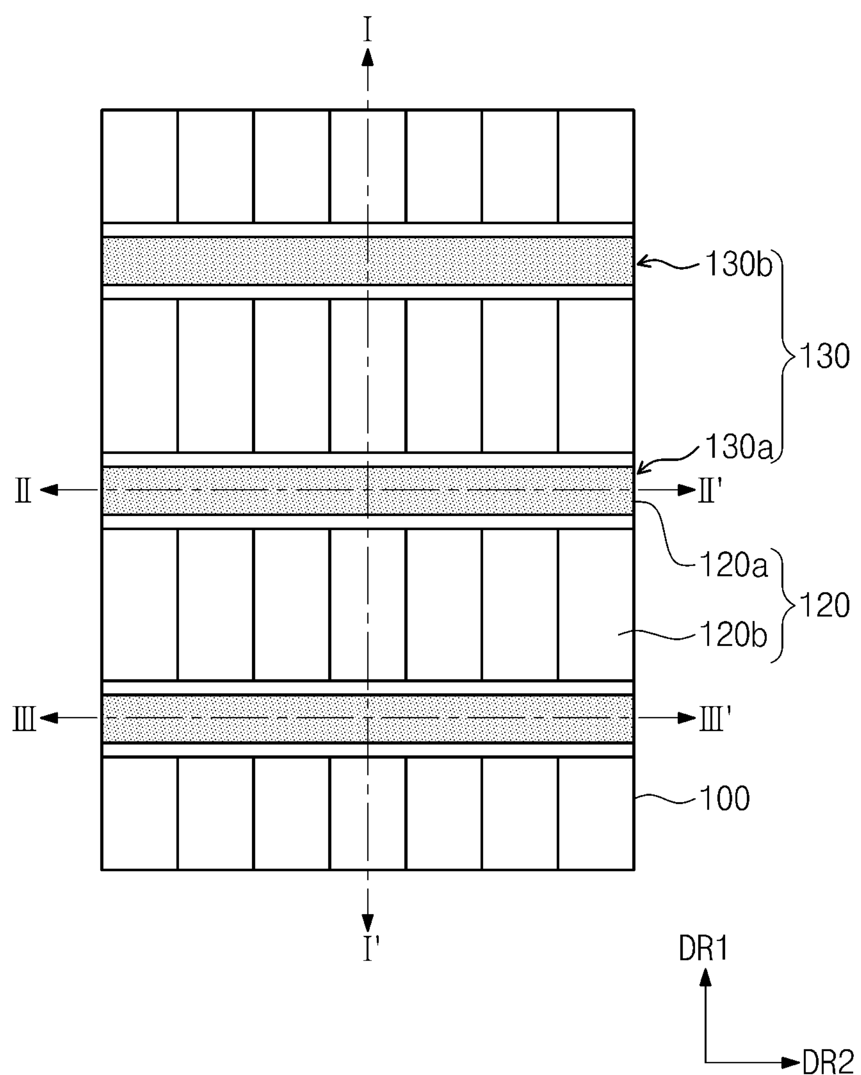
Figure 9B:
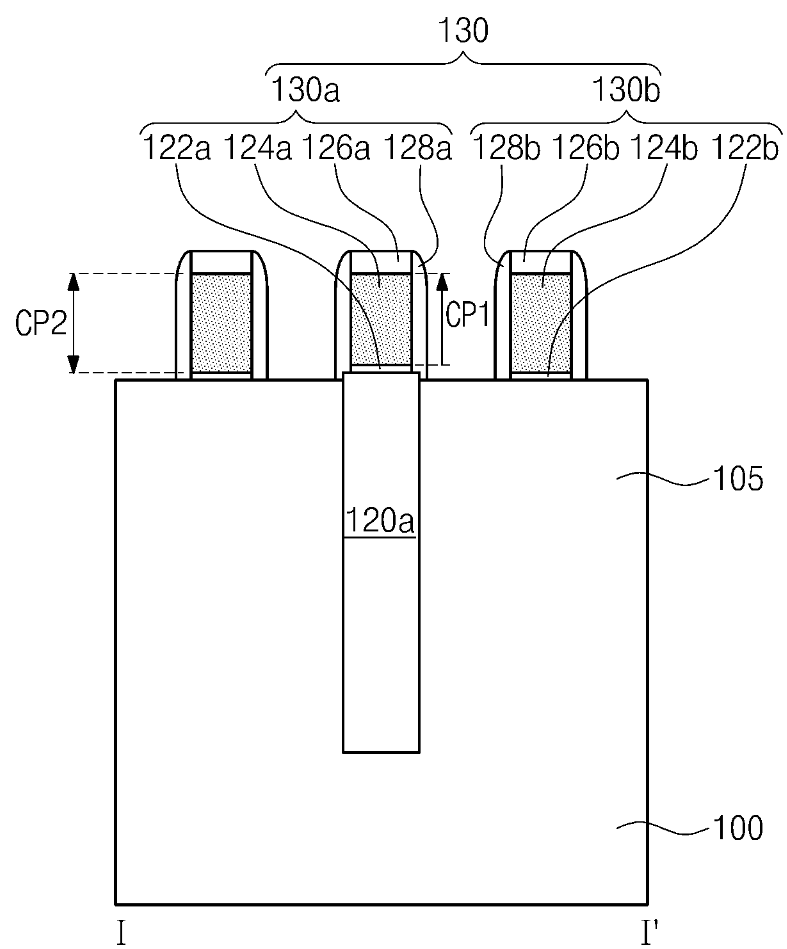
Figure 9C:
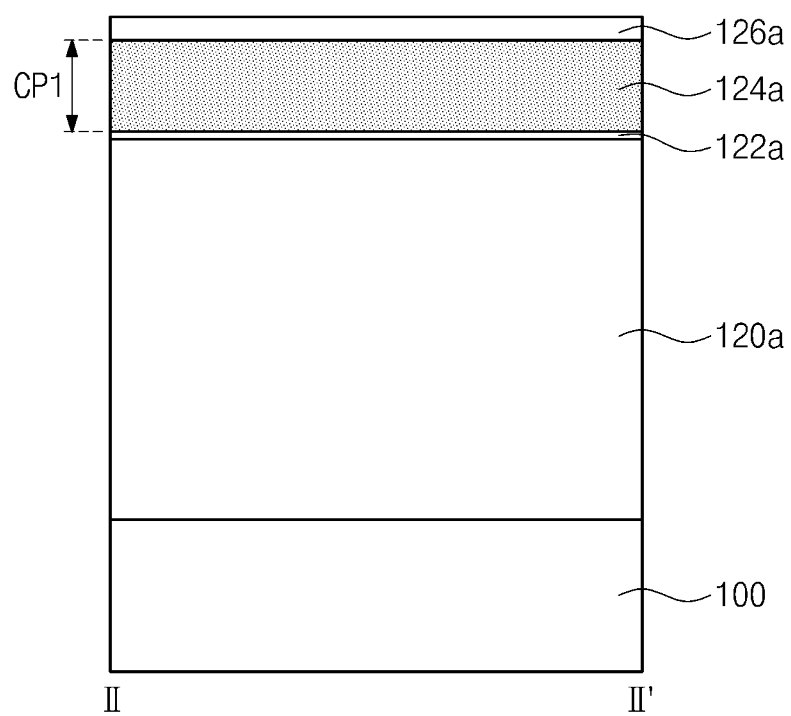
Figure 9D:
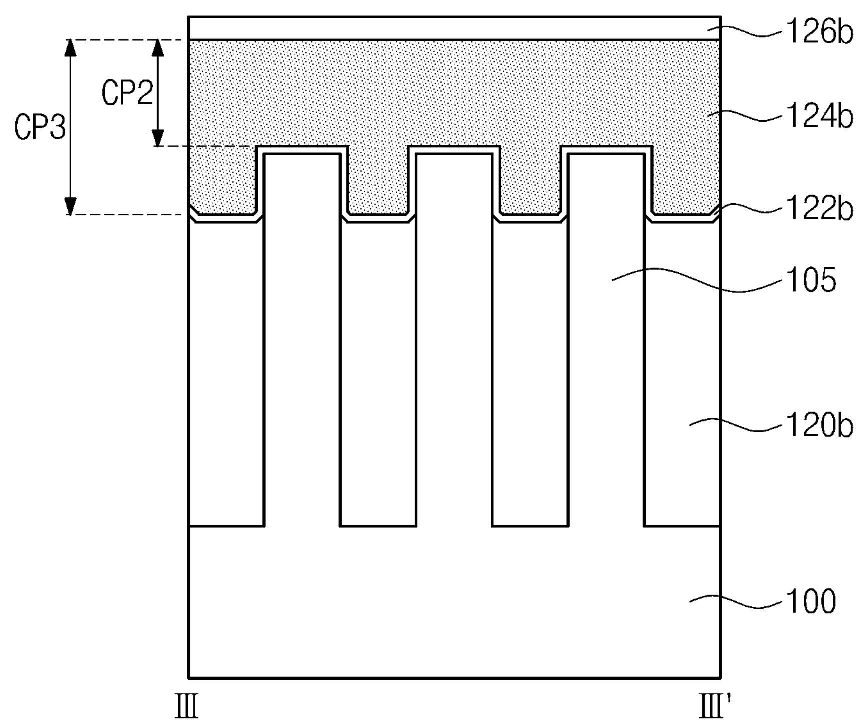
Figure 10A:
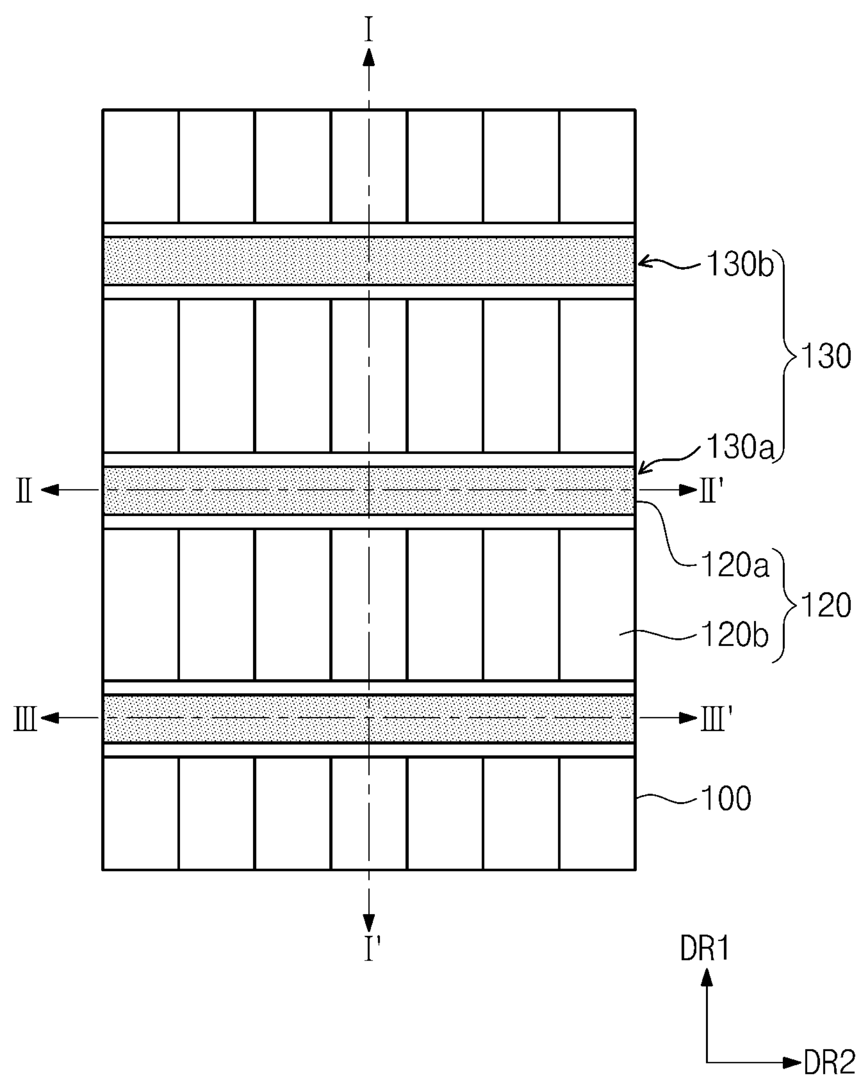
Figure 10B:
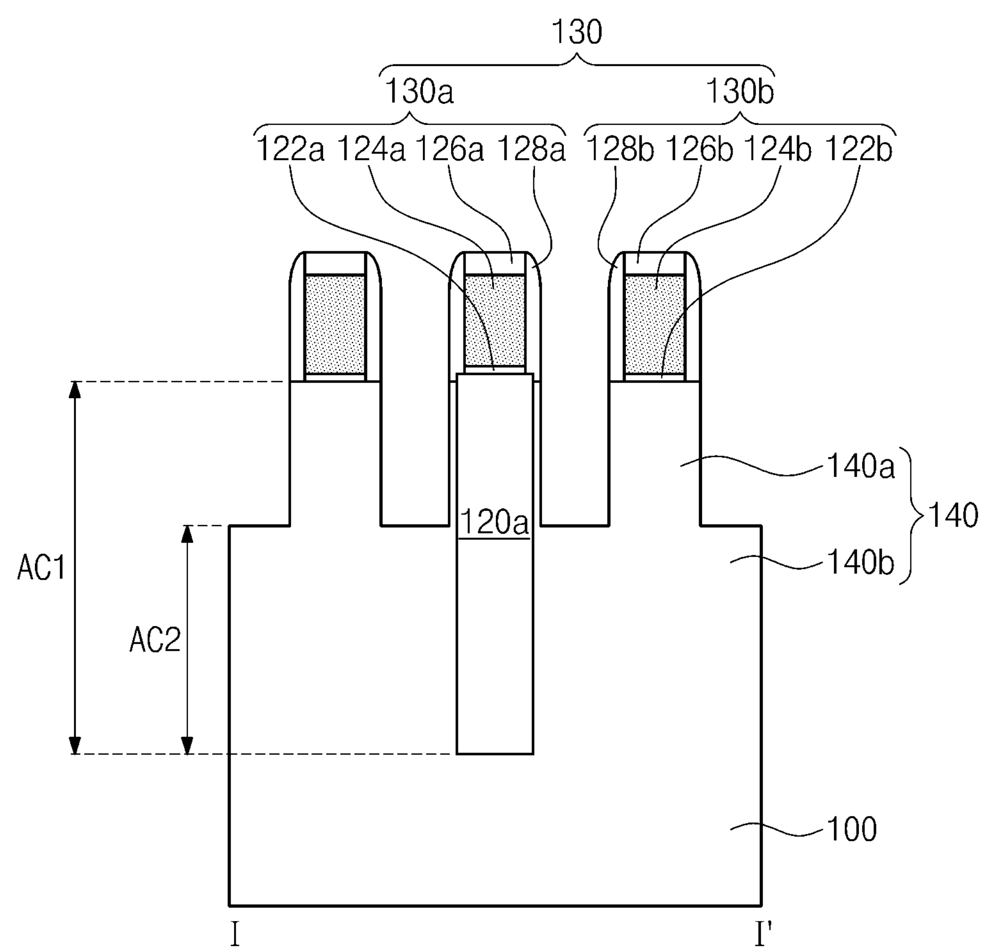
Figure 10C:
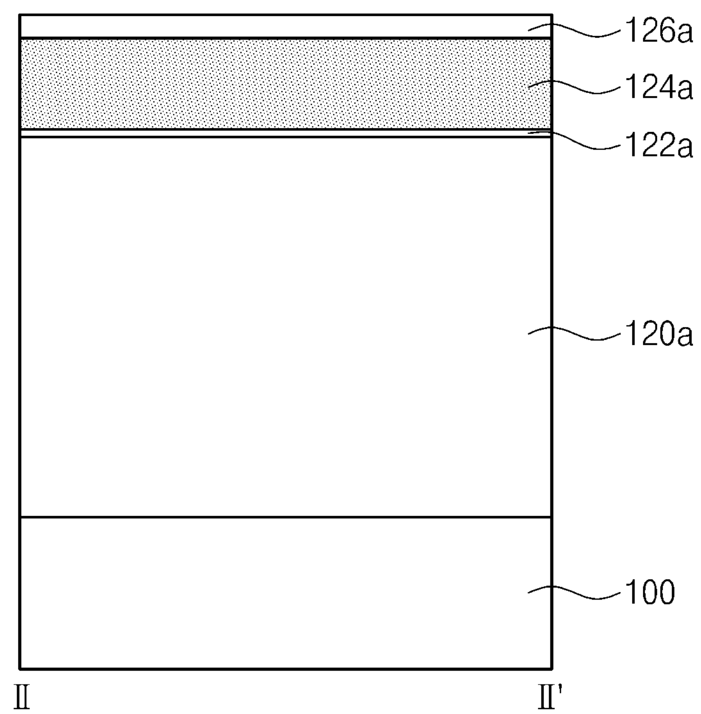
Figure 10D:
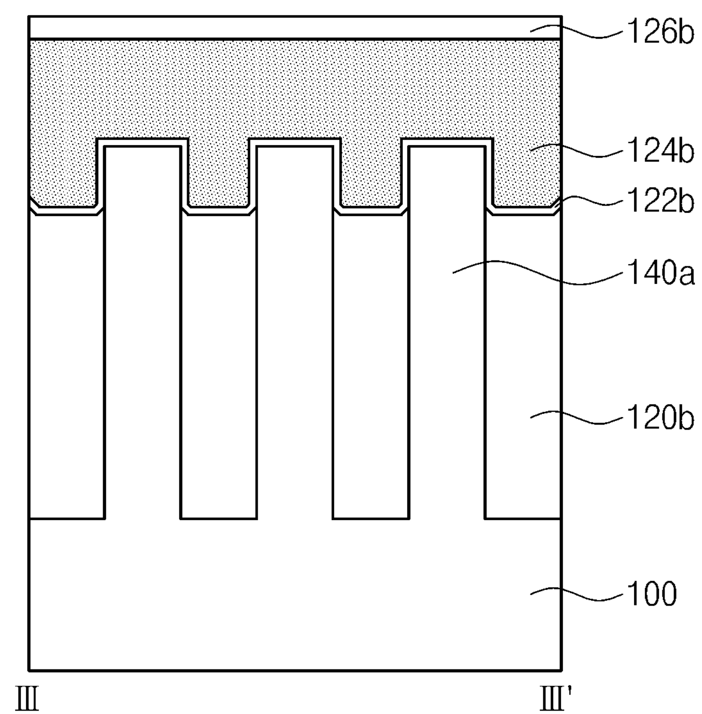
Figure 11A:
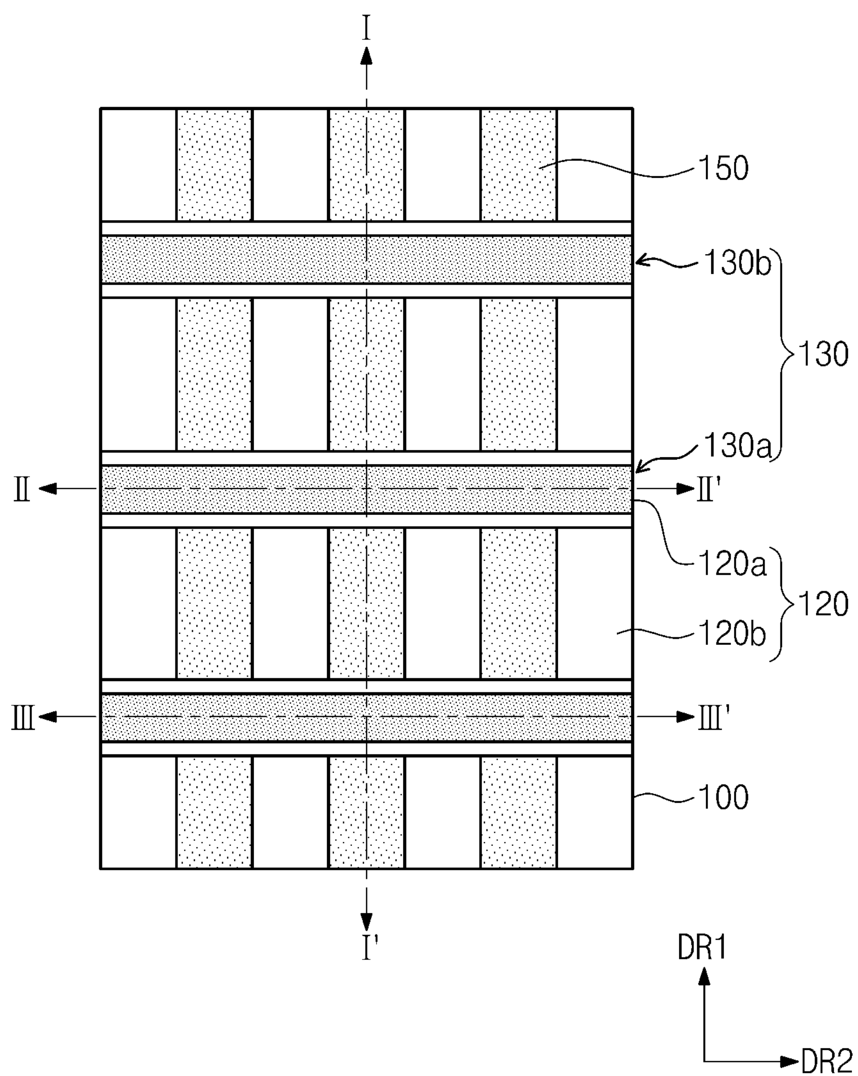
Figure 11B:
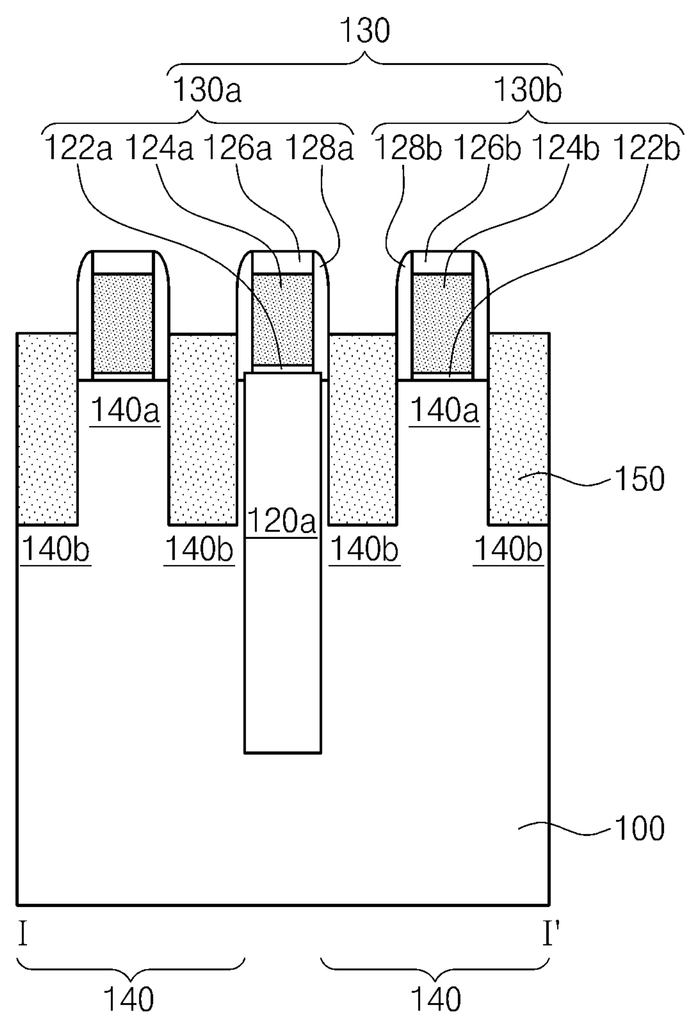
Figure 11C:
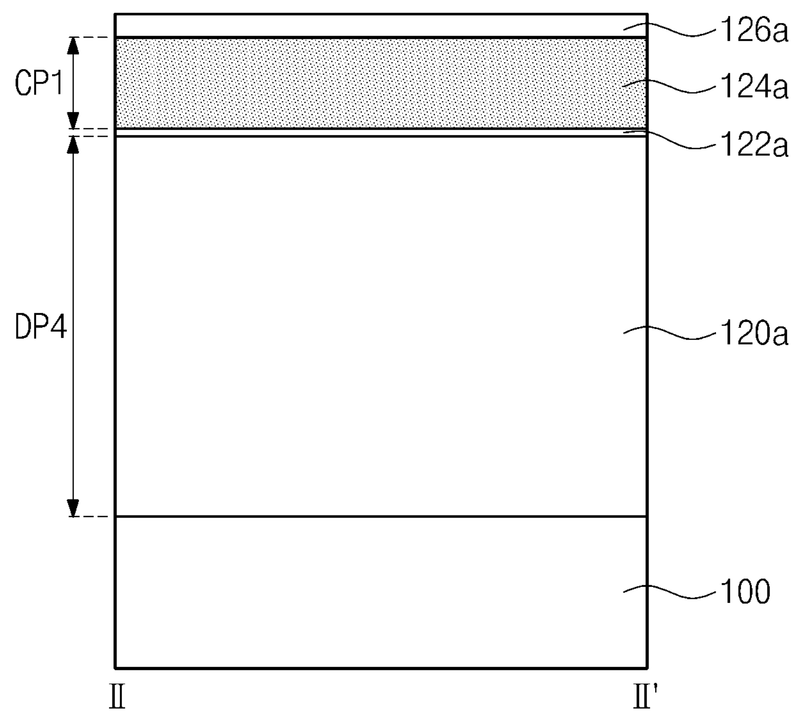
Figure 11D:
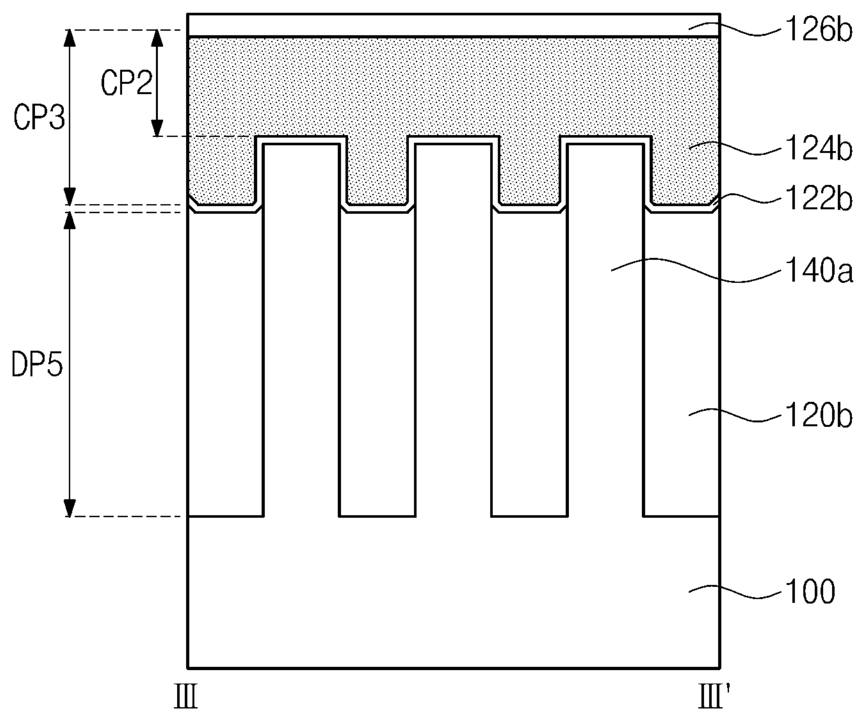

The first region 110a of the preliminary device isolation pattern 110 may be recessed to form the first device isolation region 120a of the device isolation pattern 120. The first device isolation region 120a may have a fourth thickness DP4. The top surface of the first device isolation region 120a may be disposed at a substantially same level as or a higher level than a top surface of the substrate 100. More specifically, in some embodiments, the top surface of the first device isolation region 120a is higher than the top surface of the substrate structure adjacent to the first device isolation region 120a as shown in FIG. 8B, and the height difference is, for example, more than 30 angstroms. The second region 110b of the preliminary device isolation pattern 110 may be recessed to form the second device isolation region 120b. In some embodiments, the height difference between the top surface of the second device isolation region 120b and the top surface of the substrate structure of adjacent to the second device isolation region 120b (for example, the uppermost surface of the preliminary fin-type active patterns 105) is more than 5 times bigger than the height difference between the top surface of the first device isolation region 120a and the top surface of the substrate structure adjacent to the first device isolation region 120a. The second device isolation region 120b may have a fifth thickness DP5. The fifth thickness DP5 may be smaller than the fourth thickness DP4.

As described above, the second region 110b of the preliminary device isolation pattern 110 may have the third thickness DP3 smaller than the first thickness DP1 of the first region 110a, and the top surfaces of the first and second regions 110a and 110b may be etched at the same time by the recess process. Thus, the fifth thickness DP5 of the second device isolation region 120b may be smaller than the fourth thickness DP4 of the first device isolation region 120a.

In some embodiments, the preliminary device isolation pattern 110 and the insulating layer 102 include oxides, and the insulating layer 102 may be removed during the recess process of the preliminary device isolation pattern 110. Additionally, upper portions of sidewalls of the preliminary fin-type active patterns 105 may be exposed by the second device isolation region 120b formed by the recess process.

According to some embodiments of the inventive concepts, the preliminary fin-type active patterns 105 may not be etched during the previous processes including the etching process using the second mask pattern 115 of FIGS. 4A through 4D and 5A through 5D, the removal process of the first and second mask patterns 104 and 115, and the recess process for the formation of the device isolation pattern 120. Thus, the completed device isolation pattern 120 may be self-aligned with the preliminary fin-type active patterns 105.

Referring to FIGS. 9A through 9D, pattern structures 130 may be formed on the substrate 100 having the preliminary fin-type active patterns 105.

In detail, an insulting thin layer and a material layer may be sequentially formed on the preliminary fin-type active patterns 105 and the device isolation pattern 102. The insulating thin layer may include an oxide, a nitride, and/or an oxynitride. In some embodiments, the insulating thin layer includes silicon oxide, and the insulating thin layer may be formed by a thermal oxidation process. In this case, the insulating thin layer may not be formed on the device isolation pattern 120. In other embodiments, the insulating thin layer may be formed by a deposition process. In this case, the insulating thin layer may also be formed on the device isolation pattern 120. The material layer may include poly-silicon. Next, the top surface of the material layer may be planarized. Third mask patterns 126a and 126b extending in the second direction DR2 may be formed on the material layer. The third mask patterns 126a and 126b may include a nitride and/or an oxynitride. The material layer and the insulating thin layer may be etched using the third mask patterns 126a and 126b as an etch mask to form line patterns 124a and 124b extending in the second direction DR2 and insulating patterns 122a and 122b. Spacers 128a and 128b may be formed on the sidewalls of the line patterns 124a and 124b and the insulating patterns 122a and 122b. The spacers 128a and 128b may include an oxide, a nitride and/or an oxynitride. As a result, the pattern structures 130 including the insulating patterns 122a and 122b, the line patterns 124a and 124b, and the spacers 128a and 128b may be formed on the preliminary fin-type active patterns 105 and the device isolation pattern 120.

According to some embodiments of the inventive concepts, the pattern structures 130 may include a first pattern structure 130a disposed on the first device isolation region 120a, and a second pattern structure 130b crossing over the second device isolation pattern 120b and the preliminary fin-type active pattern 105. The first pattern structure 130a may include a first insulating pattern 122a, a first line pattern 124a, and a first spacer 128a. In some embodiments, the first insulating pattern 122a may not be formed between the first device isolation pattern 120a and the first line pattern 124a. The first line pattern 124a may extend in the second direction DR2. The first line pattern 124a may have a first thickness CP1 which is substantially uniform.

The second pattern structure 130b may include a second insulating pattern 122b, a second line pattern 124b, and a second spacer 128b. The second line pattern 124b may have a second thickness CP2 on the preliminary fin-type active pattern 105 and may have a third thickness CP3 on the second device isolation region 120b. The first thickness CP1 of the first line pattern 124a may be substantially equal to the second thickness CP2 of the second line pattern 124b. The third thickness CP3 may be greater than the second thickness CP2. The perspective views of the first and the second line patterns 124a and 124b are shown in FIG. 1F for a better understanding of the structures. The top surface of the first line pattern 124a may be disposed at a substantially same level as the top surface of the second line pattern 124b.

In some embodiments, the insulating patterns 122a and 122b may function as gate insulating patterns, and the line patterns 124a and 124b may function as gate electrodes. In the event that the first line pattern 124a of the first pattern structure 130a functions as the gate electrode, the thickness of the first line pattern 124a may affect the electrical resistance of the gate electrode. In some embodiments, the first thickness CP1 of the first line pattern 124a may be equal to the second thickness CP2 of the second line pattern 124b, so the electrical resistance of the first line pattern 124a may be the same as or similar to the electrical resistance of the second line pattern 124b.

Referring to FIGS. 10A through 10D, the preliminary fin-type active patterns 105 may be etched using the pattern structures 130 as an etch mask to form fin-type active patterns 140.

By the etching process, the fin-type active pattern 140 may include a first active region 140a having a first thickness AC1 and a second active region 140b having a second thickness AC2 smaller than the first thickness AC1. The first active region 140a may be covered with the pattern structure 130b, and the second active region 140b may be a place on which a dopant pattern 150 of FIGS. 11A through 11D will be formed.

Referring to FIGS. 11A through 11D, the dopant pattern 150 may be formed on the second active region 140b.

In detail, a selective epitaxial growth (SEG) process may be performed on the second active region 140b to form the dopant pattern 150. In some embodiments, a dopant injection process may be performed in-situ during the SEG process. In other embodiments, a dopant injection process may be performed on the dopant pattern 150 after the SEG process.

In some embodiments, the completed semiconductor element is a PMOS fin-type transistor, and the dopants in the dopant pattern 150 may be boron (B). Additionally, the dopant pattern 150 may further be doped with carbon (C). In other embodiments, the completed semiconductor element is an NMOS fin-type transistor, and the dopants in the dopant pattern 150 may include arsenic (As) and/or phosphorus (P).

As a result, the fin-type transistor including the pattern structure and the dopant pattern 150 may be completed. In some embodiments, the first line pattern 124*a* of the first pattern structure 130*a* extending on the first device isolation region functions as the gate electrode, and the electrical resistance of the first line pattern 124*a* may be the same as or similar to the electrical resistance of the second line pattern 124*b* of the second pattern structure 130*b*.

Figure 12A:
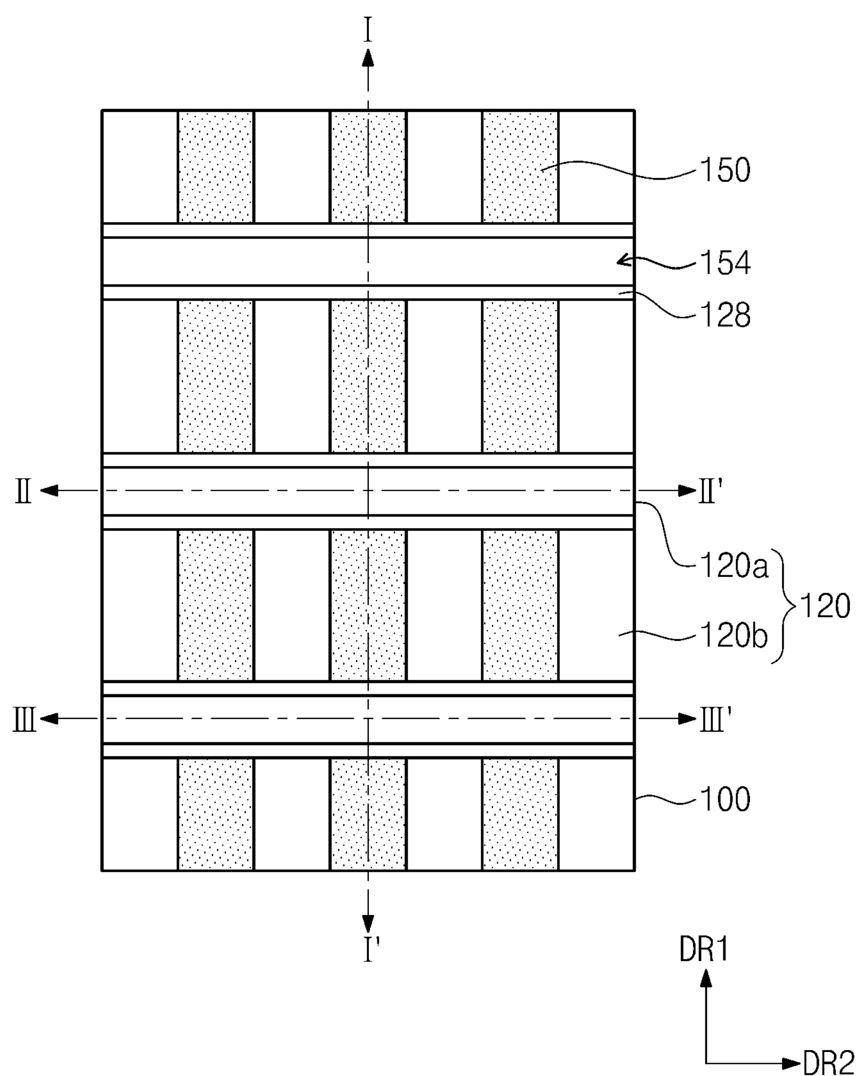
FIGS. 12A and 13A are plan views illustrating a method of manufacturing a semiconductor device according to other embodiments of the inventive concepts.
Figure 12B:
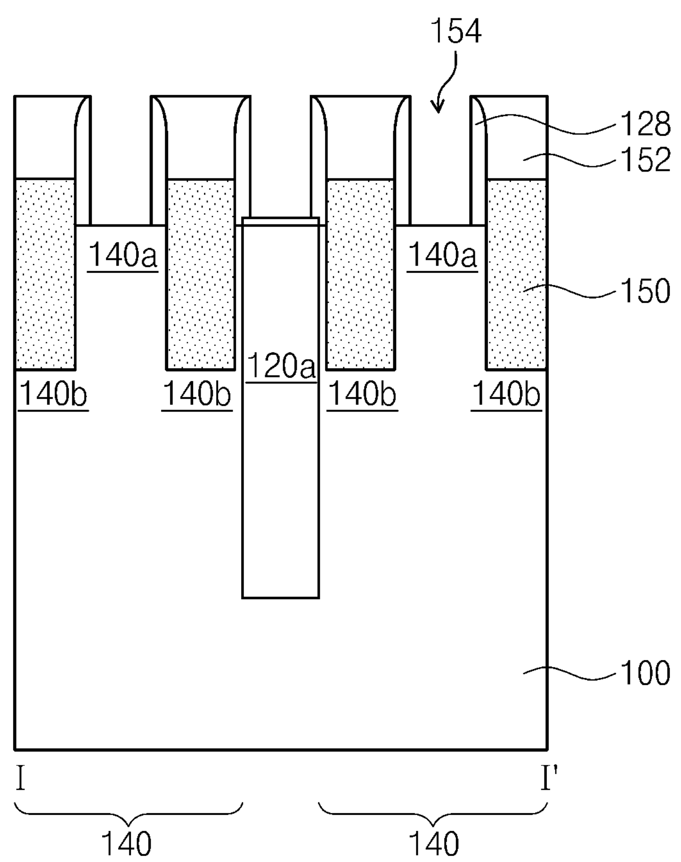
FIGS. 12B and 13B are cross-sectional views taken along lines I-I' of FIGS. 12A and 13A, respectively.
Figure 12C:
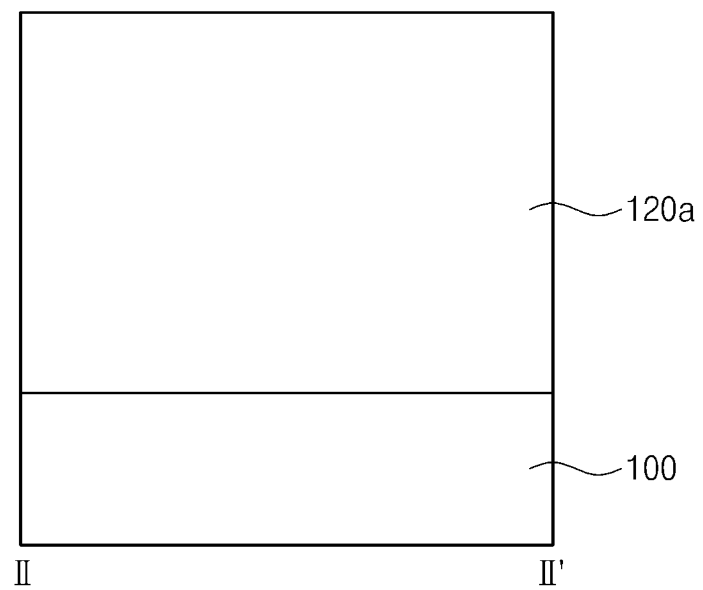
FIGS. 12C and 13C are cross-sectional views taken along lines II-II' of FIGS. 12A and 13A, respectively.
Figure 12D:
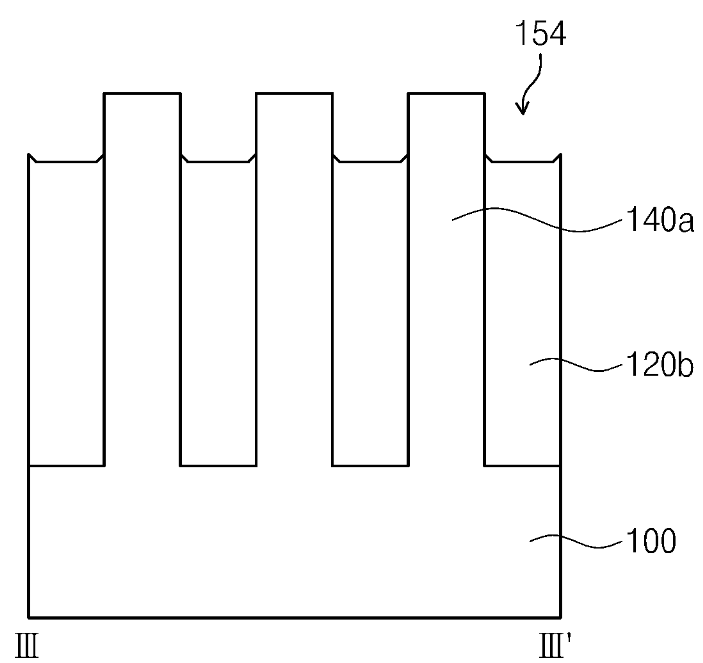
FIGS. 12D and 13D are cross-sectional views taken along lines of FIGS. 12A and 13A, respectively.
Figure 13A:
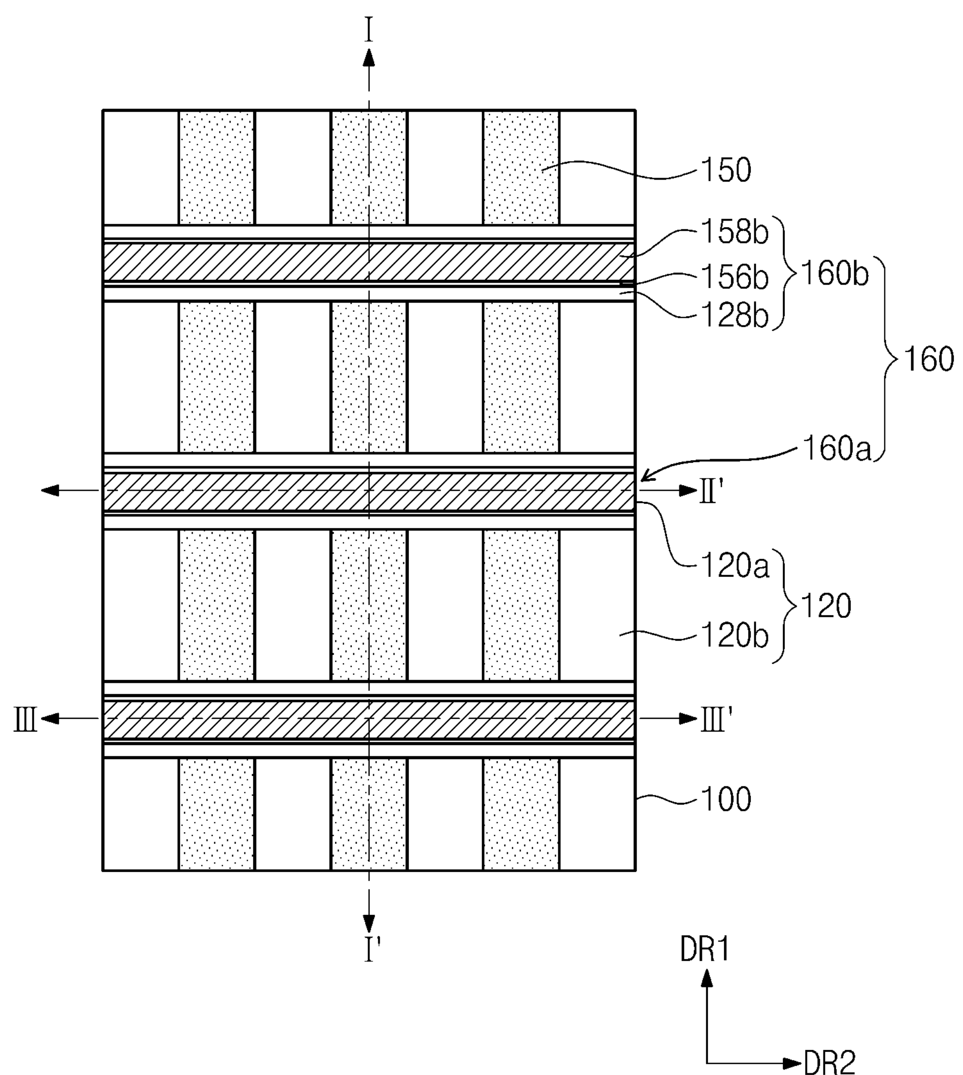
Figure 13B:
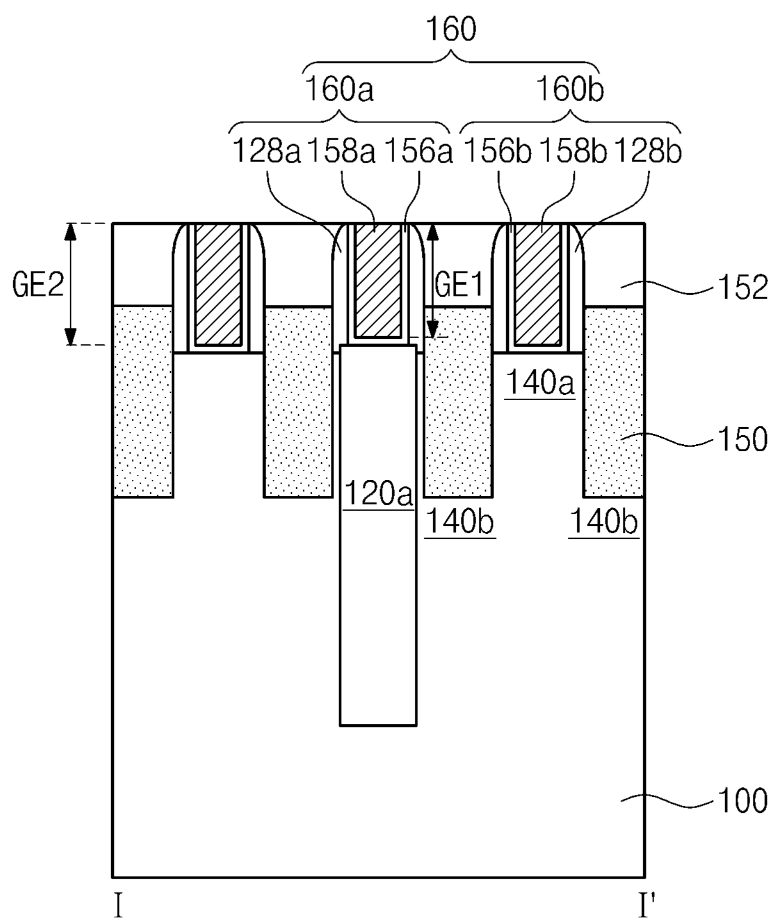
Figure 13C:
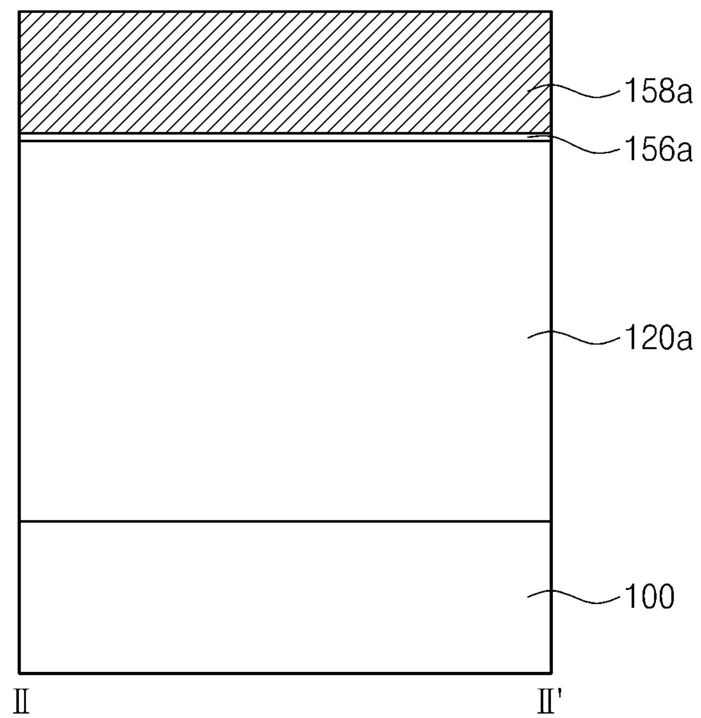
Figure 13D:
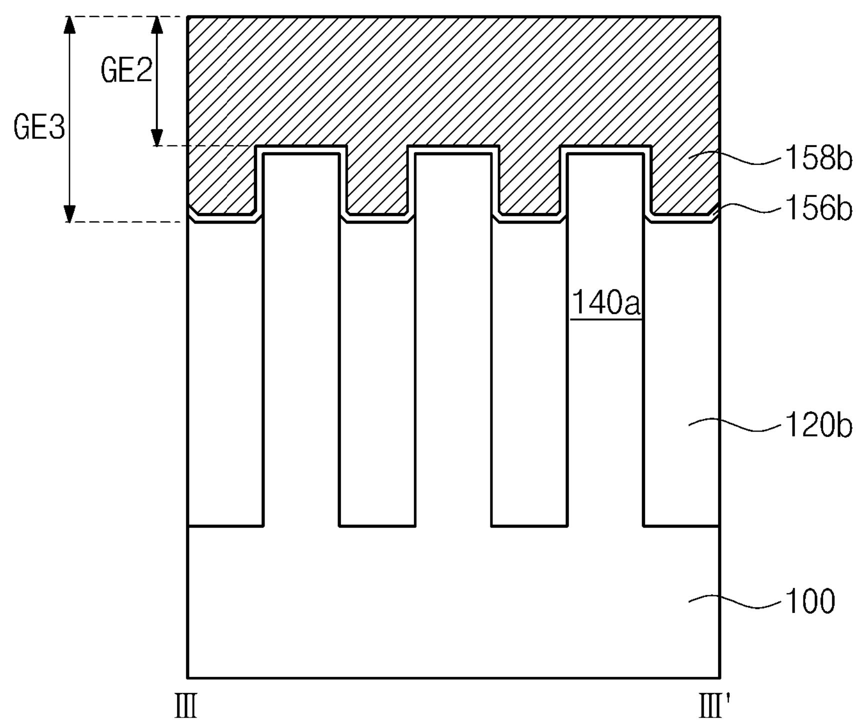

FIGS. 12A and 13A are plan views illustrating a method of manufacturing a semiconductor device according to other embodiments of the inventive concepts. FIGS. 12B and 13B are cross-sectional views taken along lines I-I' of FIGS. 12A and 13A, respectively. FIGS. 12C and 13C are cross-sectional views taken along lines II-II' of FIGS. 12A and 13A, respectively. FIGS. 12D and 13D are cross-sectional views taken along lines of FIGS. 12A and 13A, respectively.

Referring to FIGS. 12A through 12D, fin-type active patterns 140, a device isolation pattern 120, pattern structures 130, and dopant patterns 150 may be formed on a substrate 100. The fin-type active patterns 140, the device isolation pattern 120, the pattern structures 130, and the dopant patterns 150 may be formed by the same processes as described with reference to FIGS. 3A through 11A, 3B through 11B, 3C through 11C, and 3D through 11D, and thus, the descriptions thereof are omitted here.

Referring to FIGS. 12A through 12D, an interlayer insulating layer 152 may be formed on the pattern structures 130, and the line patterns 124*a* and 124*b* and the insulating patterns 122*a* and 122*b* of the pattern structures 130 may be then removed.

In detail, the interlayer insulating layer 152 may be formed on the pattern structures 130, and the interlayer insulating layer 152 may be then planarized until the top surfaces of the pattern structures 130 are exposed. The line patterns 124*a* and 124*b* and the insulating patterns 122*a* and 122*b* of the pattern structures 130 may be removed to form openings 154 partially exposing the fin-type active patterns 140 and the device isolation pattern 120.

Referring to FIGS. 13A through 13D, gate insulating patterns 156*a* and 156*b* and gate electrodes 158*a* and 158*b* may be formed on the fin-type active patterns 140 and the device isolation pattern 120 in the openings 154.

In detail, a gate insulating layer may be conformally formed on the fin-type active patterns 140 and the device isolation pattern 120 which are exposed by the openings 154. The gate insulating layer may include a high-k dielectric material having a dielectric constant higher than that of silicon oxide. For example, the gate insulating layer may include at least one of, but not limited to, hafnium oxide, hafnium-silicon oxide, lanthanum oxide, lanthanum-aluminum oxide, zirconium oxide, zirconium-silicon oxide, tantalum oxide, titanium oxide, barium-strontium-titanium oxide, barium-titanium oxide, strontium-titanium oxide, yttrium oxide, aluminum oxide, lead-scandium-tantalum oxide, or lead-zinc niobate.

A gate electrode layer may be formed on the gate insulating layer to fill the openings 154. In some embodiments, the gate electrode layer may have a multi-layered structure. For example, the gate electrode layer may include a lower electrode layer capable of controlling a work function and an upper electrode layer. The lower electrode layer may include, for example, at least one of titanium nitride (TiN), tantalum nitride (TaN), titanium carbide (TiC), or tantalum carbide (TaC). The upper electrode layer may include, for example, at least one of tungsten (W) and aluminum (Al). The gate electrode layer and the gate insulating layer may be planarized so that the top surface of the interlayer insulating layer 152 is exposed, thereby forming the gate electrodes 158*a* and 158*b* and the gate insulating patterns 156*a* and 156*b*. As a result, gate structures 160 may be formed.

According to some embodiments of the inventive concepts, the gate structures 160 may include a first gate structure 160*a* disposed on the first device isolation region 120*a*, and a second gate structure 160*b* disposed on the first active region 140*a* and the second device isolation region 120*b*. The first gate structure 160*a* may include a first gate insulating pattern 156*a*, a first gate electrode 158*a*, and a first spacer 128*a*. The first gate electrode 158*a* may have a first thickness GE1. The second gate structure 160*b* may include a second gate insulating pattern 156*b*, a second gate electrode 158*b*, and a second spacer 128*b*. The second gate electrode 158*b* may have a second thickness GE2 on the first active region 140*a* and may have a third thickness GE3 on the second device isolation region 120*b*. The first thickness GE1 of the first gate electrode 158*a* may be substantially equal to the second thickness GE2 of the second gate electrode 158*b*. The third thickness GE3 of the second gate electrode 158*b* may be greater than the second thickness GE2 of the second gate electrode 158*b*. The perspective views of the respective first and second gate electrodes 158*a* and 158*b* are similar to the perspective views of the first and the second line patterns 124*a* and 124*b* shown in FIG. 1F. The top surface of the first gate electrode 158*a* may be disposed at a substantially same level as the top surface of the second gate electrode 158*b*.

Thus, the fin-type transistor including the gate structure 160 and the dopant pattern 150 may be completed. The electrical resistance of the first gate electrode 158*a* of the first gate structure 160*a* on the first device isolation region 120*a* may be substantially equal to the electrical resistance of the second gate electrode 158*b* of the second gate structure 160*b*.

Figure 14A:
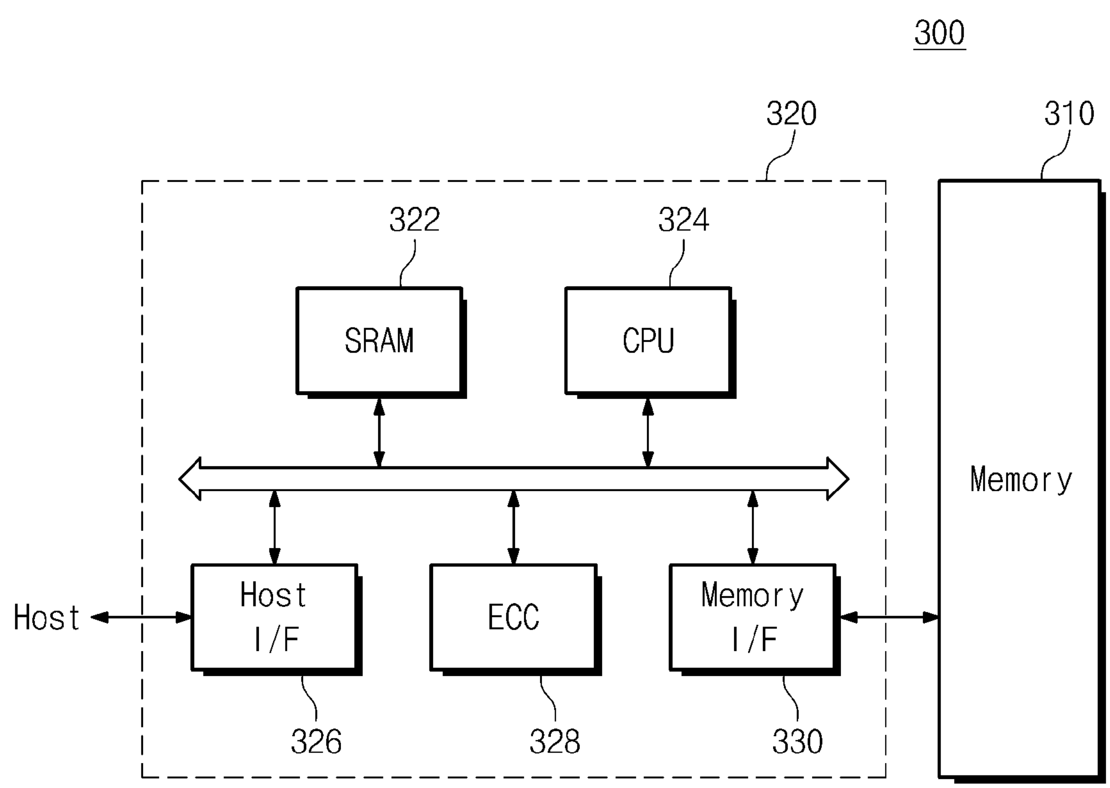
FIG. 14A is a schematic block diagram illustrating a memory card including a semiconductor device according to embodiments of the inventive concepts.

FIG. 14A is a schematic block diagram illustrating a memory card including a semiconductor device according to an embodiment of the inventive concepts.

Referring to FIG. 14A, the semiconductor device may be applied to a memory card 300. For example, the memory card 300 may include a memory controller 320 that controls data communication between a host and a memory device 310. A static random access memory (SRAM) device 322 may be used as a working memory of a central processing unit (CPU) 324. A host interface (I/F) unit 326 may be configured to include a data communication protocol between the memory card 300 and the host. An error check and correction (ECC) block 328 may detect and correct errors of data which are read out from the memory device 310. A memory interface unit 330 may interface with the memory device 310. The CPU 324 controls overall operations of the memory controller 320.

Figure 14B:
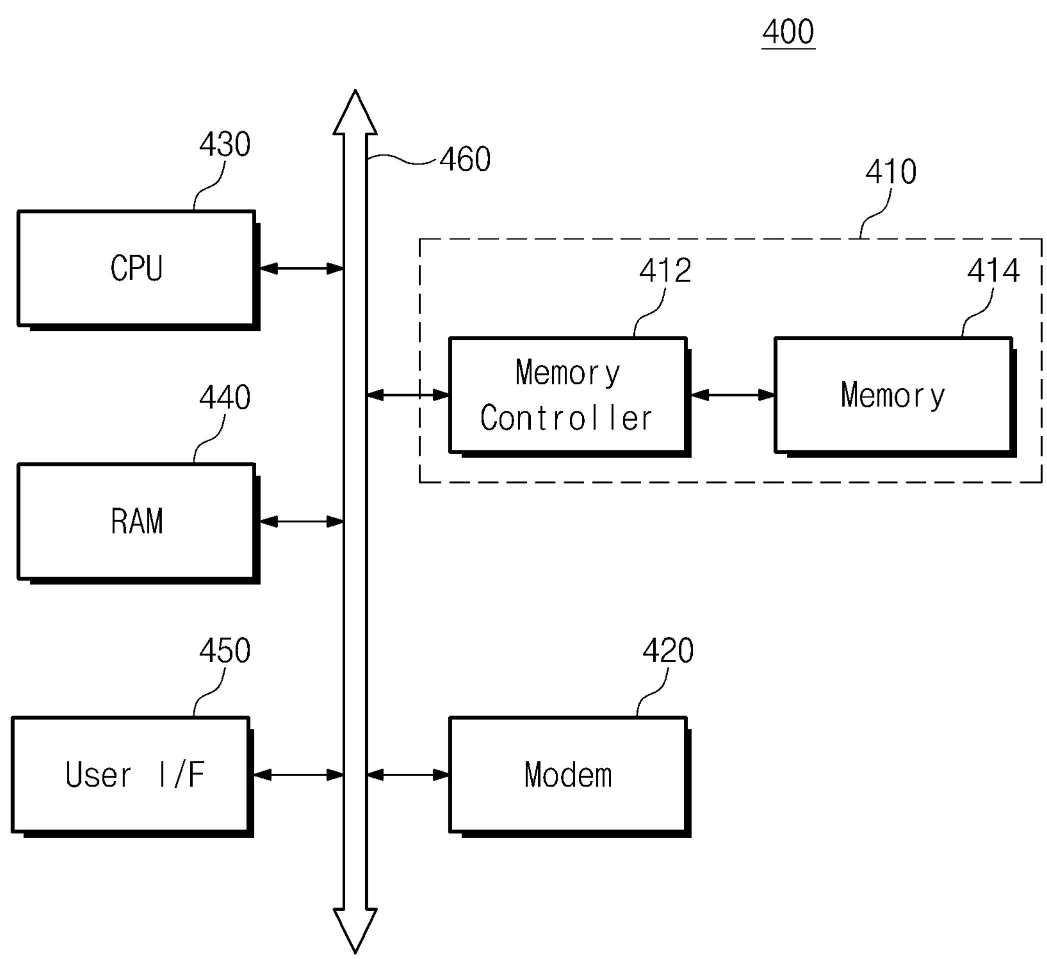
FIG. 14B is a schematic block diagram illustrating an information processing system applied with a semiconductor device according to embodiments of the inventive concepts.

FIG. 14B is a schematic block diagram illustrating an information processing system applied with a semiconductor device according to an embodiment of the inventive concepts.

Referring to FIG. 14B, an information processing system 400 may include at least one of the semiconductor devices according to the embodiments described above. The information processing system 400 may include an electronic device, such as a mobile device or a computer. For example, the information processing system 400 may include a modem 420, a central processing unit (CPU) 430, a random access memory (RAM) device 440, and a user interface unit 450 that are electrically connected to a memory system 410 through a system bus 460. The memory system 410 may store data processed by the CPU 430 or inputted from an external system. The memory system 410 may include a memory device 414 and a memory controller 412. The memory system 410 may have, for example, substantially the same structure as the memory card 300 described with reference to FIG. 14A. The information processing system 400 may be realized as, for example, an electronic device such as a memory card, a solid state disk (SSD) device, a camera image sensor, and another type of application chipset. For example, if the memory system 410 may be realized as the SSD device, the information processing system 400 may stably and reliably store massive data.

The different electronic devices described herein, such as memory device 414, memory controller 412, memory card 300, etc., may include at least one of the semiconductor devices according to the example embodiments of the inventive concepts as mentioned above. These electronic devices may include, for example, a semiconductor device such as a semiconductor chip formed from a wafer, or a semiconductor package, or a package-on-package semiconductor device.

According to embodiments of the inventive concepts, the thickness of the line pattern formed on the first device isolation region may be substantially equal to the thickness of the line pattern formed on the fin-type active pattern, so the line pattern on the first device isolation region may have a sufficient thickness to be used as the gate electrode.

While the disclosure have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the claims of this application and their equivalents, and shall not be restricted or limited by the foregoing description.

What is claimed is:

1. A method of manufacturing a semiconductor device, the method comprising:
- etching a substrate using a first mask pattern formed on the substrate to form a trench;
- forming a preliminary device isolation pattern filling the trench and including a first region and a second region, each of the first and second regions having a first thickness;
- forming a second mask pattern on the first region;
- etching an upper portion of the second region and a portion of the first mask pattern, which are exposed by the second mask pattern, to form the second region having a second thickness smaller than the first thickness;
- removing the first and second mask patterns; and
- etching upper portions of the first region and the second region having the second thickness to form a device isolation pattern defining preliminary fin-type active patterns.

2. The method of claim 1, wherein the first mask pattern is removed by a phosphoric acid strip process, and
- wherein the first mask pattern includes a nitride.

3. The method of claim 1, wherein each of the preliminary fin-type active patterns has a rectangular shape extending in a first direction,
- wherein the preliminary fin-type active patterns are spaced apart from each other in the first direction and a second direction perpendicular to the first direction,
- wherein the first region of the preliminary device isolation pattern is formed between the preliminary fin-type active patterns spaced apart from each other in the first direction, and
- wherein the second region of the preliminary device isolation pattern is formed between the preliminary fin-type active patterns spaced apart from each other in the second direction.

4. The method of claim 1, wherein the second mask pattern is removed by an ashing process and/or a strip process, and
- wherein the second mask pattern includes a photoresist pattern.

5. The method of claim 1, wherein a top surface of the second region having the second thickness is disposed at a level higher than a top surface of the substrate.

6. The method of claim 5, further comprising:
- etching the second region having the second thickness to form a third thickness smaller than the second thickness,
- wherein the top surface of the second region having the third thickness is disposed at a substantially same level as the top surface of the substrate.

7. The method of claim 1, wherein etching the upper portions of the first region and the second region having the second thickness to form a device isolation pattern defining preliminary fin-type active patterns comprises:
- etching an upper portion of the first region of the preliminary device isolation pattern to form a first device isolation region of the device isolation pattern; and
- etching an upper portion of the second region of the preliminary device isolation pattern to form a second device isolation region of the device isolation pattern,
- wherein the first device isolation region of the device isolation pattern has a top surface disposed at a substantially same level as a top surface of the substrate, and
- wherein the second device isolation region of the device isolation pattern has a top surface disposed at a level lower than the top surface of the substrate.

8. The method of claim 7, further comprising:
- forming pattern structures including a first pattern structure and a second pattern structure, the first pattern structure disposed on the first device isolation pattern, and the second pattern structure crossing over the preliminary fin-type active patterns and the second device isolation pattern;
- etching the preliminary fin-type active patterns exposed by the pattern structures to form fin-type active patterns; and
- forming dopant patterns on the fin-type active patterns at both sides of each of the pattern structures.

9. The method of claim 8, wherein forming the pattern structures comprises:
- sequentially forming an insulating layer and a material layer on the preliminary fin-type active patterns and the device isolation pattern;
- planarizing a top surface of the material layer;
- forming third mask patterns on the planarized material layer;
- etching the planarized material layer and the insulating layer using the third mask patterns as an etch mask to form line patterns and insulating patterns; and forming spacers on sidewalls of the line patterns and insulating patterns.

10. The method of claim 9, wherein the line pattern of the first pattern structure has a third thickness on the first device isolation region, wherein the line pattern of the second pattern structure has a fourth thickness on the fin-type active pattern and has a fifth thickness on the second device isolation region, wherein the fourth thickness is substantially equal to the third thickness, and the fifth thickness is greater than the fourth thickness.

11. The method of claim 9, further comprising:

forming an interlayer insulating layer on the substrate having the pattern structures and the dopant patterns;

removing the line patterns and insulating patterns of the pattern structures to form openings exposing the device isolation pattern and the fin-type active patterns; and forming gate insulating patterns and gate electrodes in the openings to form gate structures.

12. A semiconductor device comprising:

a plurality of fin-type active patterns protruding from a substrate, each of the fin-type active patterns having a rectangular shape extending in a first direction, and the fin-type active patterns spaced apart from each other in the first direction and a second direction perpendicular to the first direction;

a device isolation pattern including a first device isolation region having a first thickness and a second device isolation region having a second thickness smaller than the first thickness, the first device isolation region disposed between the fin-type active patterns spaced apart from each other in the first direction, and the second device isolation region disposed between the fin-type active patterns spaced apart from each other in the second direction;

a first gate structure extending in the second direction on the first device isolation region, the first gate structure including a first insulating pattern and a first gate electrode;

a second gate structure extending in the second direction on the fin-type active patterns and the second device isolation region, the second gate structure including a second insulating pattern and a second gate electrode; and dopant patterns disposed on the fin-type active patterns at both sides of the second gate structure, wherein the thickness of the first gate electrode is substantially equal to the thickness of the second gate electrode disposed on the fin-type active pattern.

13. The semiconductor device of claim 12, wherein a top surface of the first gate structure is disposed at a substantially same level as a top surface of the second gate structure.

14. The semiconductor device of claim 12, wherein a top surface of the first device isolation region is disposed at a substantially same level as a top surface of the fin-type active pattern under the second gate structure.

15. The semiconductor device of claim 12, wherein a top surface of the second device isolation region is lower than a top surface of the fin-type active pattern under the second gate structure.

16. A method of manufacturing an electronic device, comprising steps of:

forming a first mask pattern on a substrate;

etching the substrate using the first mask pattern to form a trench;

forming a preliminary device isolation pattern filling the trench and having a first and a second regions which have a first thickness;

forming a second mask pattern on the first region and on a portion of the substrate adjacent to the first region;

etching an upper portion of the second region and a portion of the first mask pattern, which are exposed by the second mask pattern, to form the second region having a second thickness smaller than the first thickness;

etching the second region having the second thickness to form a third thickness smaller than the second thickness;

removing the first and second mask patterns;

etching an upper portion of the first region of the preliminary device isolation pattern to form a first device isolation region of the device isolation pattern; and etching an upper portion of the second region of the preliminary device isolation pattern to form a second device isolation region of the device isolation pattern, wherein a top surface of the first device isolation region of the device isolation pattern is at a different level from a top surface of the substrate adjacent to the first device isolation region.

17. The method of claim 16, wherein the top surface of the first device isolation region of the device isolation pattern is more than 30 angstroms higher than the top surface of the substrate adjacent to the first device isolation region.

18. The method of claim 16, wherein the step of etching an upper portion of the first region of the preliminary device isolation pattern to form the first device isolation region of the device isolation pattern, and the step of etching an upper portion of the second region of the preliminary device isolation pattern to form the second device isolation region of the device isolation pattern are performed in the same process.

19. The method of claim 16, wherein the height difference between a top surface of the second device isolation region and the top surface of the substrate adjacent to the second device isolation region is more than 5 times bigger than the height difference between the top surface of the first device isolation region and the top surface of the substrate adjacent to the first device isolation region.

20. The method of claim 16, further comprising:

assembling the substrate to form an electronic device, wherein the electronic device is a computer or a mobile device.

* * * * *